United States Patent
Kern et al.

(10) Patent No.: US 9,203,437 B2
(45) Date of Patent: Dec. 1, 2015

(54) CIRCUITRY AND METHOD FOR CORRECTING 3-BIT ERRORS CONTAINING ADJACENT 2-BIT ERROR

(71) Applicants: Thomas Kern, Munich (DE); Ulrich Backhausen, Taufkirchen (DE); Thomas Rabenalt, Unterhaching (DE); Christian Badack, Luebben (DE); Michael Goessel, Mahlow (DE)

(72) Inventors: Thomas Kern, Munich (DE); Ulrich Backhausen, Taufkirchen (DE); Thomas Rabenalt, Unterhaching (DE); Christian Badack, Luebben (DE); Michael Goessel, Mahlow (DE)

(73) Assignee: Infineon Technologies AG, Neubiberg (DE)

( * ) Notice: Subject to any disclaimer, the term of this patent is extended or adjusted under 35 U.S.C. 154(b) by 357 days.

(21) Appl. No.: 13/720,780

(22) Filed: Dec. 19, 2012

(65) Prior Publication Data
US 2014/0173386 A1 Jun. 19, 2014

(51) Int. Cl.
*H03M 13/15* (2006.01)
*H03M 13/00* (2006.01)
*H03M 13/53* (2006.01)

(52) U.S. Cl.
CPC ........ *H03M 13/152* (2013.01); *H03M 13/1575* (2013.01); *H03M 13/616* (2013.01)

(58) Field of Classification Search
CPC ... H03M 13/152; H03M 13/15; H03M 13/09; H03M 13/091; H03M 13/116; H03M 13/1575; H03M 13/616; G06F 11/1068; G06F 11/1072; G06F 11/1076; G06F 11/1008; H04L 1/0057; H04L 1/0045
See application file for complete search history.

(56) References Cited

U.S. PATENT DOCUMENTS

| | | | |
|---|---|---|---|
| 5,416,786 A * | 5/1995 | Lin et al. | 714/782 |
| 5,490,155 A | 2/1996 | Abdoo et al. | |
| 5,781,568 A | 7/1998 | Hsieh | |
| 6,360,349 B1 * | 3/2002 | Kawanishi | 714/785 |
| 6,536,009 B1 | 3/2003 | Bodnar | |
| 6,604,222 B1 | 8/2003 | Jensen | |
| 7,865,809 B1 * | 1/2011 | Lee et al. | 714/782 |
| 2014/0122967 A1 | 5/2014 | Kern et al. | |

OTHER PUBLICATIONS

Lin, S., et al., "Error Control Coding," Prentice Hall, 1983, pp. 141-160.

(Continued)

*Primary Examiner* — April Y Blair
*Assistant Examiner* — Dipakkumar Gandhi
(74) *Attorney, Agent, or Firm* — Slater & Matsil, L.L.P.

(57) ABSTRACT

A circuitry is proposed for the correction of errors in a possibly erroneous binary word $v'=v'_1, \ldots, v'_n$ relative to a codeword $v=v_1, \ldots, v_n$, in particular 3-bit errors containing an adjacent 2-bit error (burst error). The circuitry comprises a syndrome generator and a decoder. A modified BCH is used wherein n' column vectors of a first BCH code submatrix are paired as column vector pairs so that a componentwise XOR combination of the two column vectors of each column vector pair produces an identical column vector K that is different from all column vectors of the first BCH submatrix. A second BCH submatrix comprises corresponding column vectors as the third power, according to Galois field arithmetic, of the column vector in the first BCH submatrix. The syndrome generated by the syndrome generator can be checked against the columns of the first and second submatrices.

24 Claims, 9 Drawing Sheets

(56) References Cited

OTHER PUBLICATIONS

Okano, H., et al., "A Construction Method of High Speed Decoders Using ROM's for Bose-Chaudhuri-Hocquenghem and Reed-Solomon Codes," IEEE Transactions on Computers, Oct. 1987, pp. 1165-1171, vol. C-36, No. 10.

Rupprecht, W., et al., "Nachrichtentechnik," Springer Verlag, 1967, pp. 339-341.

Datta, R., et al., "Generating Burst-error Correcting Codes from Orthogonal Theoretic Approach," 2011 IEEE International Symposium on Defect Nanotechnology Systems, Oct. 3-5, 2011, pp. 367-373.

Dutta, A., et al. "Multiple Bit Upset Tolerant Memory Using a Selective Cycle Avoidance Based SEC-DED-DAEC Code," $25^{th}$ IEEE VLSI Test Symposium, May 6-10, 2007, pp. 349-354.

"Single bit Error Correction, Double bit Error Detection, Or SECDED ECC," http://members.home.nl/ddwhite/ECC-DRAM1.htm, Nov. 6, 2012, 6 pages.

\* cited by examiner

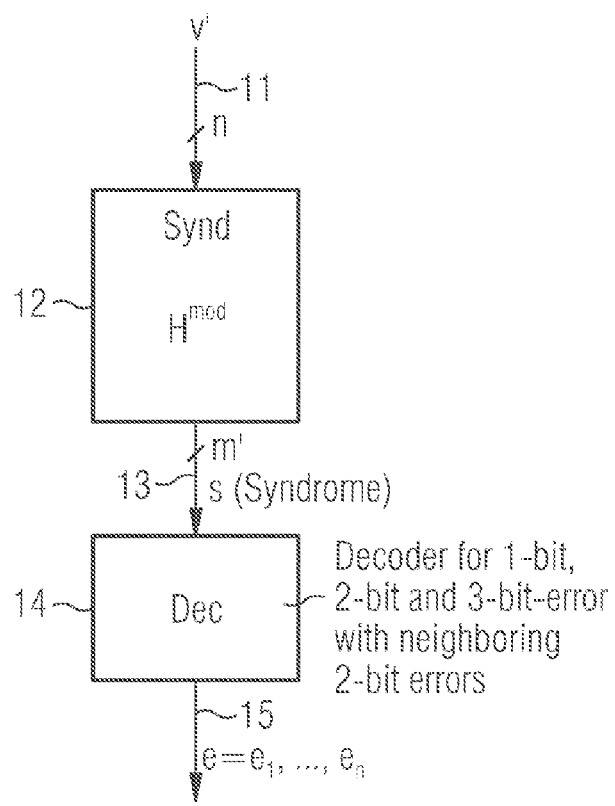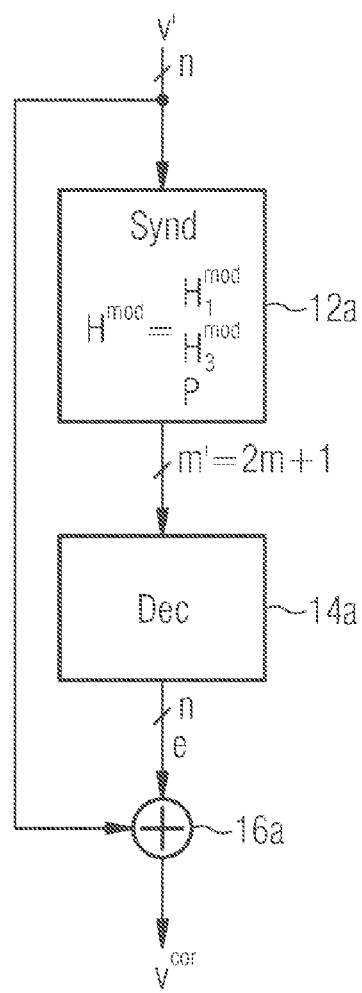

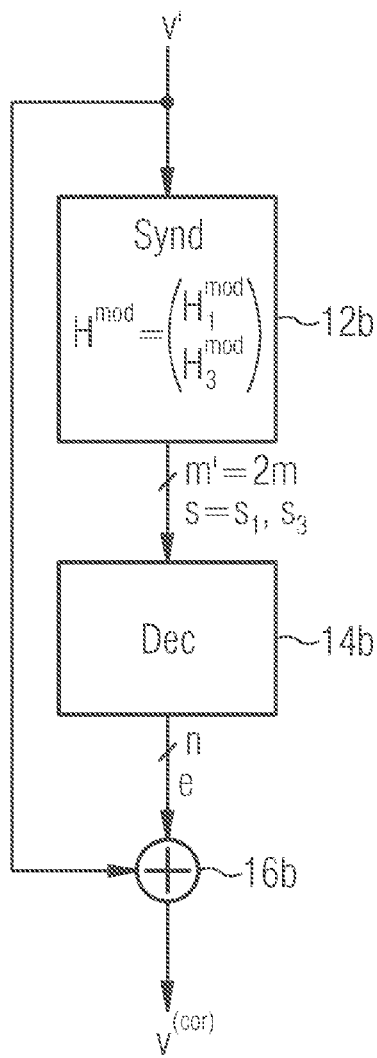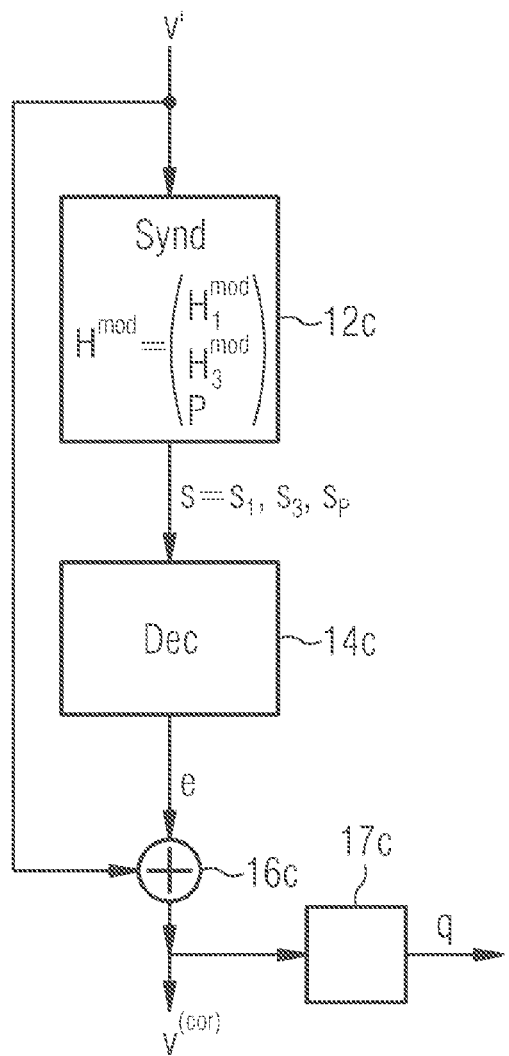

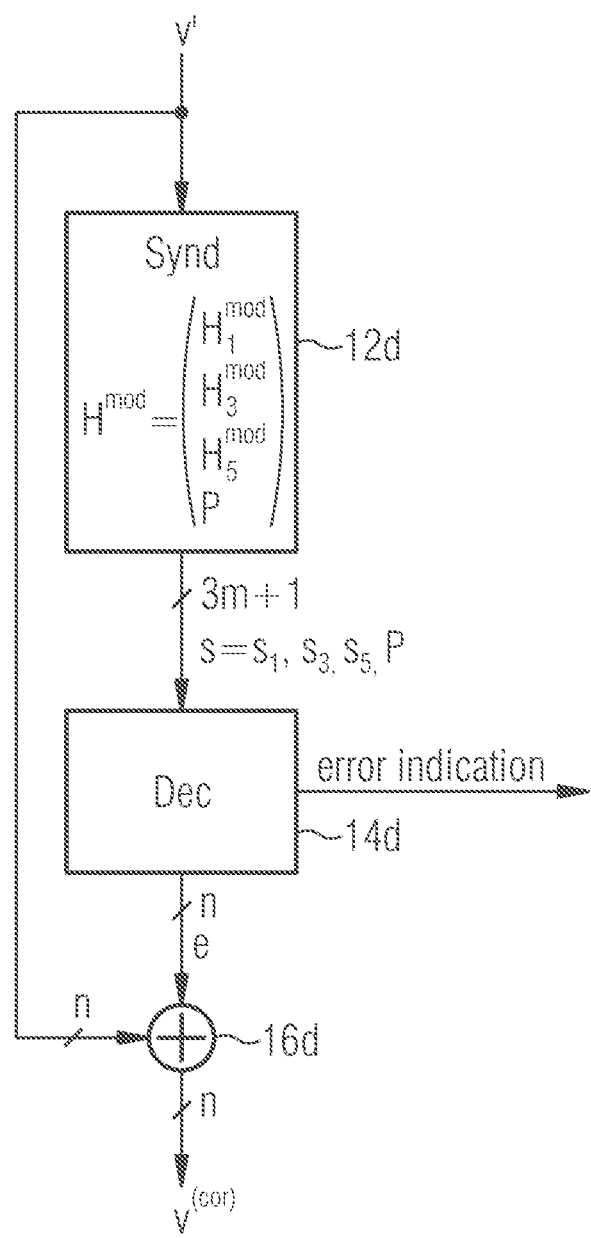

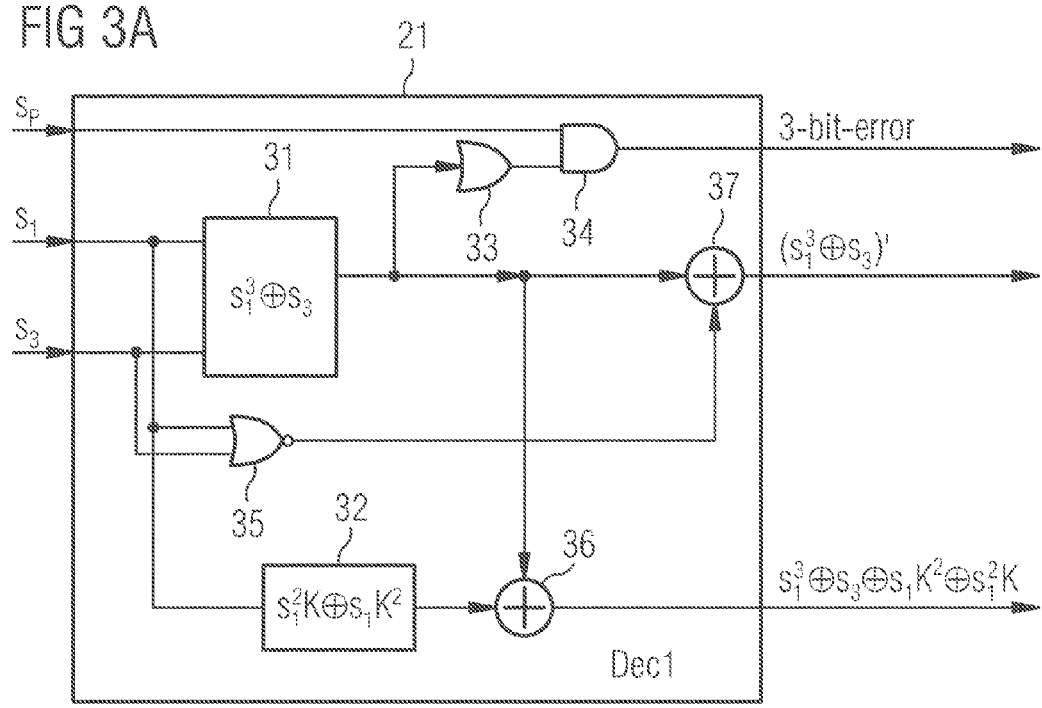
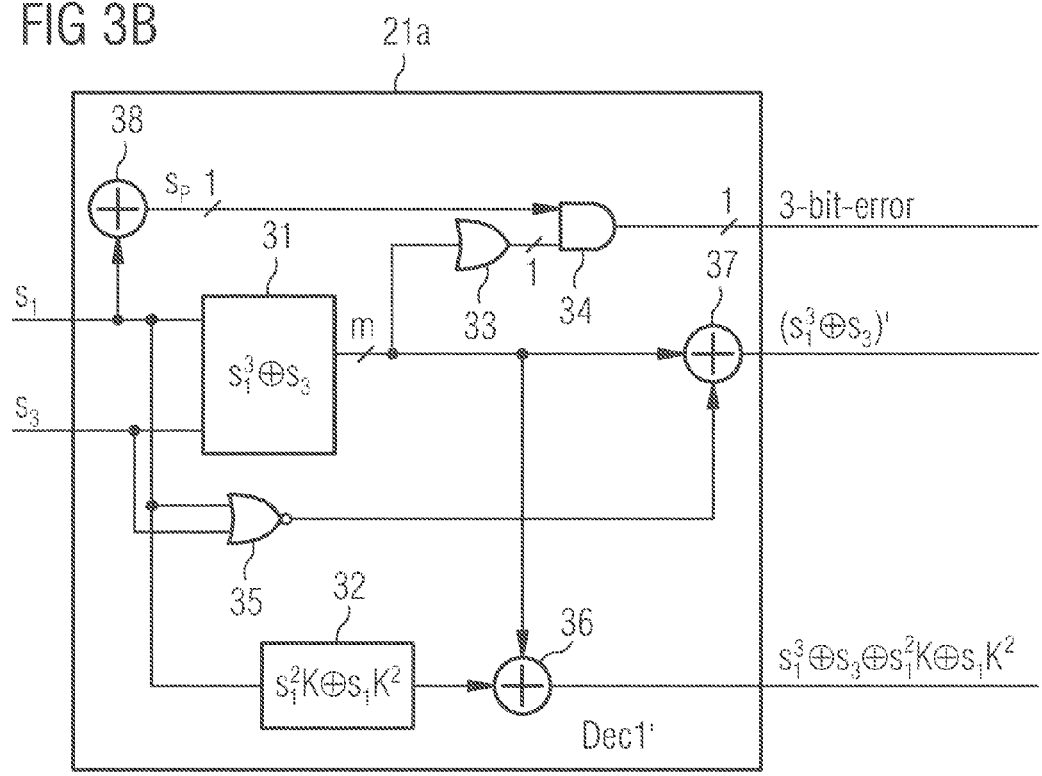

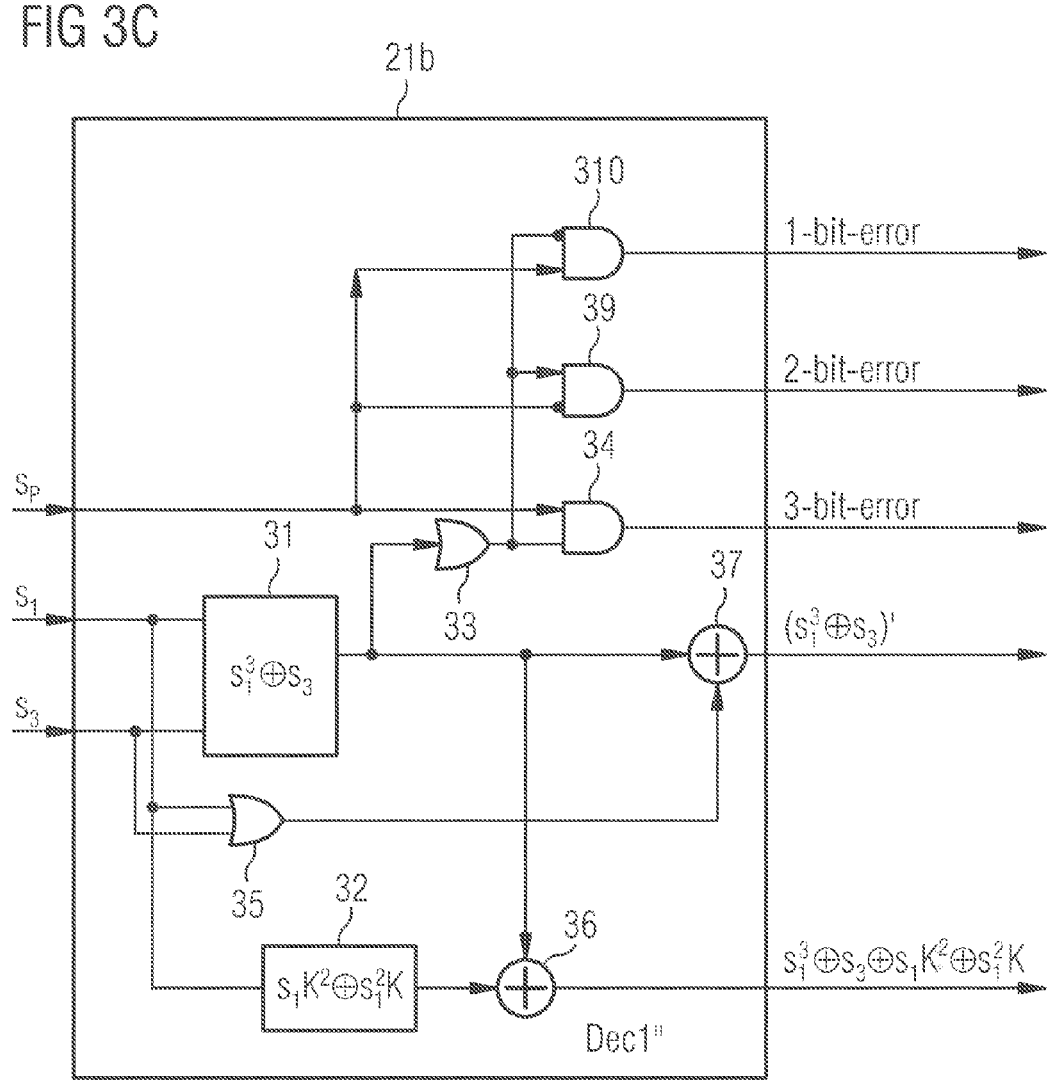

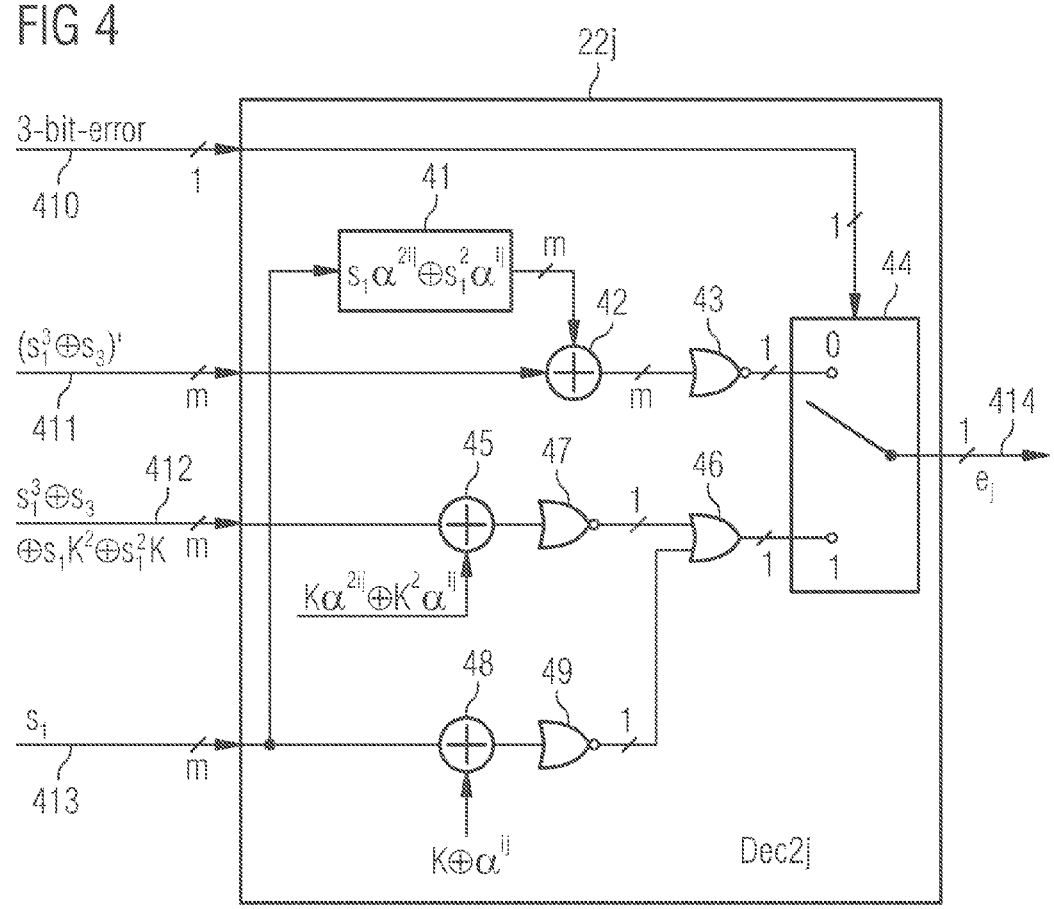

FIG 7

902 determining an error syndrome $s = (s_1, s_3)$ of a modified BCH coded with a H-matrix $H^{mod}$ comprising a first BCH submatrix $H_1^{mod}$ and a second BCH submatrix $H_3^{mod}$, and with a code distance $d \geq 5$, wherein $n'$ column vectors of the submatrix $H_1^{mod}$ are paired as column vector pairs so that a componentwise XOR combination of the two column vectors of each column vector pair produces an identical column vector $K$ that is different from all column vectors of the BCH submatrix $H_1^{mod}$, and where $n'$ is even and $4 \leq n' \leq n$ applies, wherein the second BCH submatrix $H_3^{mod}$ comprises a corresponding column vector for each column vector in the first BCH submatrix $H_1^{mod}$ so that the corresponding column vector is the third power, according to Galois field arithmetic, of the column vector in the first BCH submatrix $H_1^{mod}$, wherein the error syndrome $s$ is determined by multiplying the H-matrix $H^{mod}$ with the possibly erroneous binary word $v'$ so that a first error syndrome portion is given by $s_1 = H_1^{mod} \cdot v'$ and a second error syndrome portion is given by $s_3 = H_3^{mod} \cdot v'$

904 generating the correction vector $e = (e_1, ..., e_n)$ with correction values $e_j = e_{j+1} = e_l = 1$ and $e_t = 0$ for $t \neq j, j+1, l$, if $s_1$ equals the componentwise XOR combination of the identical column vector $K$ and a column vector at a column position $l$ of the first BCH submatrix $H_1^{mod}$, and $s_3$ equals the componentwise XOR combination of column vectors at column positions $j, j+1,$ and $l$ of the second BCH submatrix $H_3^{mod}$

CIRCUITRY AND METHOD FOR CORRECTING 3-BIT ERRORS CONTAINING ADJACENT 2-BIT ERROR

BACKGROUND

It is known, in binary sequences or binary words of a certain length N, to correct 1-bit errors and any 2-bit errors using BCH codes by combinational error correction circuits as it is for example described in Okano, H. and Imai, H., "A construction method of high speed decoders using ROM's for Bose-Chadhuri-Hocquenghem and Reed Solomon Codes", IEEE Trans. Comp. C36 (10) 1165-1175, 1987.

If BCH codes are used over a Galois field $GF(2^m)$, then $N \leq 2^m - 1$ and the error syndrome s may consist of 2m components, wherein the first m components form the sub-syndrome $s_1$ and the second m components form the sub-syndrome $s_3$ as it is common when using BCH codes. If the overall parity is considered, the error syndrome comprises a further binary component which is to be designated by $s_P$.

It is further known to correct any 3-bit errors by combinational error correction circuits using BCH codes, as it is for example also described in the document by Okano, H. and Imai, H., "A construction method of high speed decoders using ROM's for Bose-Chadhuri-Hocquenghem and Reed Solomon Codes", IEEE Trans. Comp. C36 (10) 1165-1175, 1987. When correcting any 3-bit errors, in addition to the sub-syndromes $s_1$ and $s_3$ a further sub-syndrome $s_5$ may be used which like the sub-syndromes $s_1$ and $s_3$ that generally also comprises a word width of m bits, so that the error syndrome $s = s_1, s_3, s_5$ generally comprises a word width of 3·m and taking into account the overall parity comprises a word width of 3m+1.

The correction of any 3-bit errors by combinational error correction circuits is here connected with a relatively high hardware effort and a relatively great signal runtime for the determination of the corresponding error correction signals, which may be disadvantageous. In particular, a relatively long signal runtime for the correction signals may be limiting with respect to the clock rate.

For certain circuitries it may be more likely that, when 3 bits in a binary word are erroneous, two of these erroneous bits occur in specific bit positions than that all three erroneous bits are randomly distributed.

An example for one such case may be a data storage whose memory cells may take on more than two states, in general one multivalued state each. If a data storage for example takes on 4 different states, then a memory state of a cell stores the information of two particular bits. These bits which are stored in the same memory cell are here designated as neighboring bits. Generally these bits will also be spatially adjacent in the data word to be stored. It is of course also possible to store the information of two bits which are not directly adjacent in the data word in one memory cell, like the value of the first and the seventh bits, the second and the thirteenth bits, etc. In this way of speaking, the first and the seventh bit and the second and the thirteenth bit are adjacent. In order to make the description as simple as possible, it is in the following always assumed, that neighboring bits which are for example stored in a memory cell are also spatially neighboring in the considered data word. If this is not the case, it may be acquired by a simple exchange of the bits of the data word that neighboring bits are also spatially neighboring. Thus, it is not necessary in the following to differentiate between neighboring bits which are neighboring as they are for example stored in the same memory cell and neighboring bits which are spatially neighboring or adjacent in the considered binary word.

If now an error of a memory state occurs which may e.g. take on 4 states, then two neighboring bits corresponding to this state may both be erroneous at the same time. If the assignment of the multivalued state of a memory cell to binary values is done via a Gray code, as it is common practice and for example proposed in Rupprecht, W., Steinbuch, K., "Nachrichtentechnik", pp 339-341, Springer Verlag 1967, then errors in state values of a memory cell which only slightly change a memory state into a physically neighboring state value, lead to a 1-bit error in one of the binary values assigned with the memory state.

Errors in a memory state of a memory cell which corrupt the correct memory state into a non-neighboring memory state lead to a 2-bit error in the neighboring binary values of the binary data assigned with the memory state.

It is possible that the bits of a word which are to be corrected are auxiliary binary read values of a ternary memory or a multiple-valued memory as it is described in the U.S. patent application Ser. No. 13/664,495, filed Oct. 31, 2012 and entitled "Circuit and Method for Multi-Bit Correction" which is included here in the description by reference in its entirety.

It would be beneficial to provide an error correction of a 2-bit error in two neighboring bits (or otherwise related to each other) with relatively low hardware effort and/or relatively short signal runtime. It would also be beneficial to provide an error correction of a 2-bit error in two neighboring bits and an additional 1-bit error in an arbitrary bit position.

SUMMARY

Embodiments of the present invention provide a circuitry for the correction of errors in a possibly erroneous binary word $v' = v'_1, \ldots v'_n$ relative to a codeword $v = v_1, \ldots, v_n$. The circuitry comprises a syndrome generator for determining an error syndrome $s = (s_1, s_3)$ according to a modified BCH code with a H-matrix $H^{mod}$ comprising a first BCH submatrix $H_1^{mod}$ and a second BCH submatrix $H_3^{mod}$ and with a code distance $d \geq 5$, wherein n' column vectors of the submatrix $H_1^{mod}$ are paired as column vector pairs so that a componentwise XOR combination of the two column vectors of each column vector pair produces an identical column vector K that is different from all column vectors of the first BCH submatrix $H_1^{mod}$ and where n' is even and $4 \leq n' \leq n$ applies. The second BCH submatrix $H_3^{mod}$ comprises a corresponding column vector for each column vector in the first BCH submatrix $H_1^{mod}$ so that the corresponding column vector is the third power, according to Galois field arithmetic, of the column vector in the first BCH submatrix $H_1^{mod}$. The syndrome generator is configured to determine the error syndrome s by multiplying the H-matrix $H^{mod}$ with the possibly erroneous binary word v' so that a first error syndrome portion is given by $s_1 = H_1^{mod} \cdot v'$ and a second error syndrome portion is given by $s_3 = H_3^{mod} \cdot v'$. The circuitry further comprises a decoder for generating a correction vector $e = (e_1, \ldots, e_n)$ with correction values $e_j = e_{j+1} = e_l = 1$ and $e_t = 0$ for $t \neq j, j+1, l$, if the first error syndrome portion $s_1$ equals the componentwise XOR combination of the identical column vector K and a column vector at a column position l of the first BCH submatrix $H_1^{mod}$, and if the second error syndrome portion $s_3$ equals the componentwise XOR combination of column vectors at column positions j, j+1, and l of the second BCH submatrix $H_3^{mod}$.

Further embodiments of the present invention provide a method for correcting errors in a possibly erroneous binary word $v' = v'_1, \ldots, v'_n$ relative to a codeword $v = v_1, \ldots, v_n$. The method comprises determining an error syndrome $s = (s_1, s_3)$ of a modified BCH code with a H-matrix $H^{mod}$ comprising a first BCH submatrix $H_1^{mod}$ and a second BCH submatrix $H_3^{mod}$, and with a code distance d≥5, wherein n' column vectors of the submatrix $H_1^{mod}$ are paired as column vector pairs so that a componentwise XOR combination of the two column vectors of each column vector pair produces an identical column vector K that is different from all column vectors of the BCH submatrix $H_1^{mod}$, and where n' is even and 4≤n'≤n applies. The second BCH submatrix $H_3^{mod}$ comprises a corresponding column vector for each column vector in the first BCH submatrix $H_1^{mod}$ so that the corresponding column vector is the third power, according to Galois field arithmetic, of the column vector in the first BCH submatrix $H_1^{mod}$. The error syndrome s is determined by multiplying the H-matrix $H^{mod}$ with the possibly erroneous binary word v' so that a first error syndrome portion is given by $s_1 = H_1^{mod} \cdot v'$ and a second error syndrome portion is given by $s_3 = H_3^{mod} \cdot v'$. The method further comprises a step of generating the correction vector $e = (e_1, \ldots, e_n)$ with correction values $e_j = e_{j+1} = e_l = 1$ and $e_t = 0$ for t≠j+1,l, if $s_1$ equals the componentwise XOR combination of the identical column vector K and a column vector at a column position l of the first BCH submatrix $H_1^{mod}$, and $s_3$ equals the component-wise XOR combination of column vectors at column positions j, j+1, and l of the second BCH submatrix $H_3^{mod}$.

BRIEF DESCRIPTION OF THE DRAWINGS

Embodiments of the present invention will be described using the accompanying figures, in which:

FIG. 1a shows a schematic block diagram of a circuitry for correcting errors in a binary word according to embodiments;

FIG. 1b shows a schematic block diagram of a circuitry for correcting errors according to further embodiments in which the overall parity of the binary word is evaluated and used;

FIG. 1c shows a schematic block diagram of a circuitry for correcting errors according to further embodiments in which the overall parity can be determined from the sub-syndrome $s_1$, because the submatrix $H_1^{mod}$ only has columns which comprise an odd number of ones;

FIG. 1d shows a schematic block diagram of a circuitry for correcting errors comprising an error indication circuit;

FIG. 1e shows a schematic block diagram of a circuitry for correcting errors that uses a further submatrix $H_5^{mod}$ in order to differentiate between 3-bit errors with neighboring 2-bit errors and other (non-correctable) 3-bit errors;

FIG. 3a shows a possible implementation of the subcircuit for forming auxiliary signals in FIG. 2a;

FIG. 3b shows a possible implementation of the subcircuit for forming auxiliary signals in FIG. 2b;

FIG. 3c shows a possible implementation of the subcircuit for forming auxiliary signals in FIG. 2a having further outputs for outputting signals "1-bit error", "2-bit error", and "3-bit error";

FIG. 4 shows a schematic logic gate diagram of a possible implementation of a decoder subcircuit for a single correction value $e_j$;

FIG. 7 shows a schematic flow diagram of a method for correcting errors in a binary word according to embodiments.

DETAILED DESCRIPTION

Figure 2A:
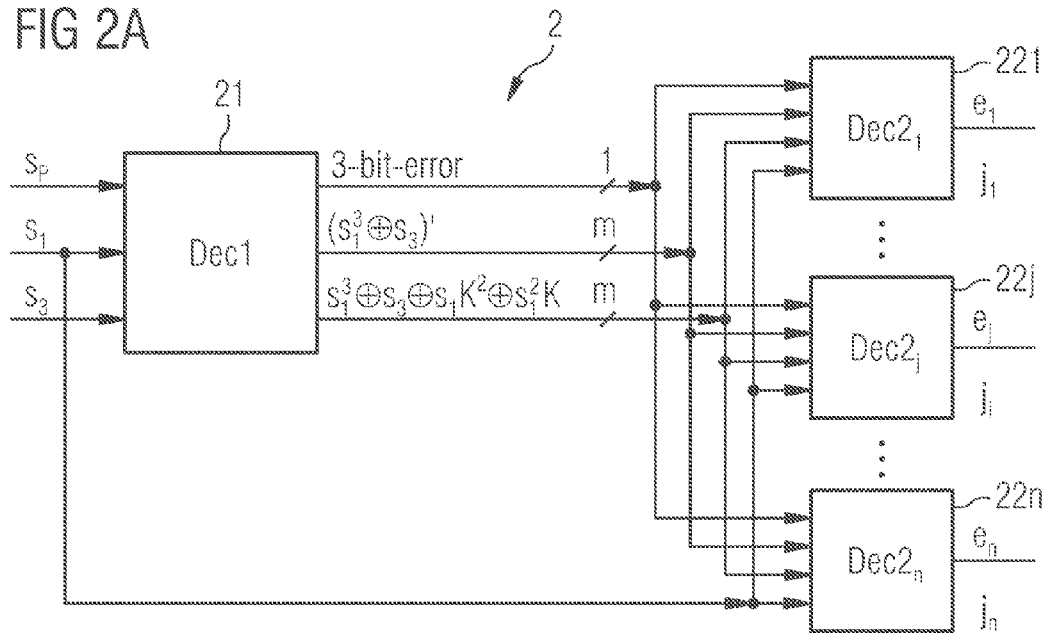
FIG. 2a shows a schematic block diagram of a decoder according to some embodiments.

A theoretical background of the embodiments of the invention will be described first.

For the error correction of randomly distributed multi-bit errors, BCH codes may be used, as it is known to a person skilled in the art and for example described in Lin, S., Costello, D. "Error Control Coding" Prentice Hall, 1983, wherein reference is in particular made to pages 143-160. Likewise reference is to be made to the document by Okano, H. and Imai, H., "A construction method of high speed decoders using ROM's for Bose-Chadhuri-Hocquenghem and Reed Solomon Codes", IEEE Trans. Comp. C36 (10) 1165-1175, 1987, in which combinational circuits for error correction of BCH codes are represented.

A BCH code is a special linear code which may be described by a parity check matrix H and a generator matrix G which may be derived from the parity check matrix. If a code comprises the length N and if it comprises k information bits, then H is an M,N matrix comprising M lines and N columns, wherein M=N−k. The generator matrix G is then a k,N matrix comprising k lines and N columns, and the code comprises M checkbits.

An unshortened 2-bit error correcting BCH code may be described by an H matrix $$H = \begin{pmatrix} H_1 \\ H_3 \end{pmatrix} = (h_1, \ldots, h_N)$$

wherein the H matrix is represented in a separate form. Conventionally, $H_1$ and $H_3$ are selected to be $$H_1 = (\alpha^0, \alpha^1, \ldots, \alpha^i, \ldots, \alpha^{N-1}) = (h_1^1, \ldots, h_i^1, \ldots, h_N^1)$$

and $$H_3 = (\alpha^0, \alpha^3, \ldots, \alpha^{3i}, \ldots, \alpha^{3(N-1)}) = (h_1^3, \ldots, h_i^3, \ldots, h_N^3)$$

when the code is not shortened. Here, α is an element of the Galois field $GF(2^m)$ and may be selected as a primitive element of a finite field $GF(2^m)$, also called Galois field. Here $N = 2^m - 1$ applies. The exponents of $\alpha^i$ and of $\alpha^{3i}$ are here determined to be modulo $2^m - 1$. $H_1$ and $H_3$ are each (m,N) matrices with m lines and $N = 2^m - 1$ columns. The elements $\alpha^i$ of the Galois field $GF(2^m)$ in their vector representation are m digit binary column vectors.

If L columns of the H matrix of the unshortened BCH code are eliminated, an H matrix of a shortened BCH code of the length n=N−L is obtained. For a shortened code the following applies n=N−L<$2^m - 1$.

It is possible to supplement the H matrix H by a line of only ones. The additional integration of the overall parity corresponds to an additional line of only ones in the H matrix.

An H matrix considering the overall parity may correspond to that of the H matrix $$H = \begin{pmatrix} H_1 \\ H_3 \\ P \end{pmatrix}$$

wherein P is a line of ones only.

Now a shortened BCH code of the length n is considered, wherein $n=N-L<2^m-1$ applies. A codeword of this code $v=v_1, \ldots, v_n$ which is also referred to as a code vector consists of n components $v_1, v_2, \ldots, v_n$. Here, a code vector may be described as a line vector or as a column vector. If a matrix is multiplied with a vector from the right, then the vector is to be interpreted as a column vector and the result is a column vector. In such a case, it is not required to explicitly highlight the corresponding vectors as being column vectors, as this is clear from the context. If it is to be especially highlighted that a vector w is represented as a column vector, it is written as $w^T$. If a codeword $v=v_1, \ldots, v_n$ is corrupted into a word $v'=v'_1, \ldots, v'_n$, then the difference between v and v' may be described by an error vector e with $$e=(e_1, \ldots, e_n)=(v_1 \oplus v'_1, \ldots, v_n \oplus v'_n)=v \oplus v'.$$

A component $e_i$ of the error vector e is equal to 1, when $v_i$ and $v'_i$ are different and $v_i = v'_i \oplus 1 = \overline{v}_i'$ applies. A component $e_j$ of the error vector e is equal to 0, when $v_j$ and $v'_j$ are the same and when $v_j = v'_j$ applies.

If an error may be corrected by an error correction circuit, then the correction values output by the error correction circuit are equal to the components of the error vector and the correction circuit outputs the correction value $e_i$ at the i-th output of its n outputs. The correction values $e_i$ may also be combined into a correction vector. The correction vector is equal to the error vector if the error may be corrected by the code.

The error syndrome $s=(s_1, s_3, s_P)$ of a word v' is determined by $$s=H \cdot v' \quad (1)$$

wherein $$s_1=H_1 \cdot v' \quad (2)$$

$$s_3=H_3 \cdot v' \quad (3)$$

and $$s_P=P \cdot v'=(1,\ldots,1) \cdot v'=v'_1 \oplus v'_2 \oplus \ldots \oplus v'_n \quad (4)$$

applies.

The error syndrome of a codeword v is equal to 0, so that for a codeword v the following applies $$s=H \cdot v=0 \quad (5)$$

and for a non-codeword $v'=v \oplus e$ $$s=H \cdot v'=H \cdot (v \oplus e)=H \cdot v \oplus H \cdot e=H \cdot e, \quad (6)$$

and the error syndrome s is determined by the error vector e.

In order to determine the assigned correct codeword from the erroneous, interfered with non-codeword v', those components $v'_j$ are to be inverted for which $e_j=1$ applies, so that $e_j$ is the corresponding correction value determined by the error correction circuit.

For the considered shortened BCH code, e is to be determined from the error syndrome $s=s_1, s_3, s_P$ with the H matrix $$H = \begin{pmatrix} H_1 \\ H_3 \\ P \end{pmatrix}$$

Here, the following applies $$H_1 = (h_1^1, h_2^1, \ldots, h_n^1) = (\alpha^{i_1}, \alpha^{i_2}, \ldots, \alpha^{i_n}) \quad (7)$$

$$H_3 = (h_1^3, h_2^3, \ldots, h_n^3) = (\alpha^{3(i_1)}, \alpha^{3(i_2)}, \ldots, \alpha^{3(i_n)}) \quad (8)$$

and $$P = \underbrace{(1, 1, \ldots, 1)}_{n}, \quad (9)$$

wherein the exponents of $\alpha$, as already indicated, are determined modulo $2^m-1$, and the exponents $i_1, i_2, \ldots, i_n$ are all different pair-wise. It is not necessary here that $i_j=j$ applies for $j=1, \ldots, n$.

If a 1-bit error exists in the j-th bit, the following applies $$s_1=\alpha^{i_j}, \quad (10)$$

$$s_3=\alpha^{3(i_j)}, \quad (11)$$

$$s_P=1 \quad (12)$$

and $s_1^3=s_3$. If a 2-bit error exists in the bit positions j and l, the following applies $$s_1=\alpha^{i_j} \oplus \alpha^{i_l}, \quad (13)$$

$$s_3=\alpha^{3(i_j)} \oplus \alpha^{3(i_l)}, \quad (14)$$

$$s_P=0 \quad (15)$$

and $s_1^3 \neq s_3$.

For a BCH code the error positions of a 1-bit error or of any 2-bit error are determined from the syndrome components $s_1$ and $s_3$ of a BCH code. In this respect, a special process for determining the error position is described.

From (13) the following results $$\alpha^{3(i_l)}=s_1^3 \oplus s_1 \alpha^{2(i_j)} \oplus s_1^2 \alpha^{i_j} \oplus \alpha^{3(i_j)}$$

and with (14)

$$s_1^3 \oplus s_3 \oplus s_1 \alpha^{2(i_j)} \oplus s_1^2 \alpha^{i_j}=0 \quad (16)$$

and completely analog to that $$s_1^3 \oplus s_3 \oplus s_1 \alpha^{2(i_l)} \oplus s_1^2 \alpha^{i_l}=0 \quad (17)$$

so that a 2-bit error in the positions j and l is determined by the two zeros or roots of the quadratic equation $$s_1^3 \oplus s_3 \oplus s_1 x^2 \oplus s_1^2 x=0 \quad (18)$$

in the Galois field $GF(2^m)$, wherein $s_1=\alpha^{i_j} \oplus \alpha^{i_l}$ and $s_3=\alpha^{3i_j} \oplus \alpha^{3i_l}$.

If now a 1-bit error is present in the j-th bit position, then $s_1^3 \oplus s_3=0$ and the two solutions of equation (18) in this case are $x=0$ and $x=s_1=\alpha^{i_j}$, so that the position j of the 1-bit error is also determined to be a solution of equation (18) which is unequal 0.

Assuming that only 1-bit, 2-bit and 3-bit errors occur, the following applies:

A 1-bit error exists when $s_1^3 = s_3$, $s_1 \neq 0$ and $s_P = 1$.
A 2-bit error exists when $s_1^3 \neq s_3$ and $s_P = 0$.
A 3-bit error exists when $s_1^3 \neq s_3$ and $s_P = 1$.
If $s_1 = s_3 = 0$, no error exists.

In summary, in case of a 1-bit error or a 2-bit error the bit positions of the errors are determined by the solutions of equation (18) which are unequal 0 and thus from the sub-syndromes $s_1$ and $s_3$.

Up to today, no method and no circuitry are known which enable to determine the error positions of a 3-bit error and thus to correct the same from knowing the sub-syndromes $s_1$, $s_3$ and $s_P$ of a BCH code.

Surprisingly, it is possible according to the invention to determine the error positions of a 3-bit error from the sub-syndromes $s_1$, $s_3$ and $s_P$ when the 3-bit error contains a 2-bit error in neighboring bits, wherein the 2-bit errors occur in certain bit pairs. Such 2-bit errors are for example of interest when bits of a binary sequence are stored in memory cells which may take on more than two states.

To be able to correct the described 3-bit errors with a neighboring 2-bit error, from the original H matrix H of the shortened BCH code a modified H matrix $H^{mod}$ with the submatrices $H_1^{mod}$ and $H_3^{mod}$ is formed by rearranging the columns $h'_1, \ldots, h'_n$ of the original H matrix $H = (h'_1, \ldots, h'_n)$.

The columns $h_1, h_2, \ldots, h_n$ of the modified H matrix $H^{mod}$ are determined so that for the columns $h_1^1, h_2^1, \ldots, h_n^1$ of the submatrix $H_1^{mod}$ for n being even the following applies $$h_1^1 \oplus h_2^1 = h_3^1 \oplus h_4^1 = h_5^1 \oplus h_6^1 = \ldots = h_{n-1}^1 \oplus h_n^1 = K \quad (19)$$

and for n being odd the following applies $$h_1^1 \oplus h_2^1 = h_3^1 \oplus h_4^1 = h_5^1 \oplus h_6^1 = \ldots = h_{n-2}^1 \oplus h_{n-1}^1 = K \quad (20)$$

Here, K is selected so that K is no column of the submatrix $H_1$.

With $h_j^1 = \alpha^{ij}$, equations (19) and (20) correspond to the equations $$\alpha^{i_1} \oplus \alpha^{i_2} = \alpha^{i_3} \oplus \alpha^{i_4} = \alpha^{i_5} \oplus \alpha^{i_6} = \ldots = \alpha^{i_{n-1}} \oplus \alpha^{i_n} = K \quad (21)$$

and $$\alpha^{i_1} \oplus \alpha^{i_2} = \alpha^{i_3} \oplus \alpha^{i_4} = \alpha^{i_5} \oplus \alpha^{i_6} = \ldots = \alpha^{i_{n-2}} \oplus \alpha^{i_{n-1}} = K. \quad (22)$$

For a simplest possible description, the different pairs of neighboring bits were here designated as pairs [1, 2], [3, 4], [5, 6], . . . . If the pairs of neighboring bits are for example designated as pairs [1, 7], [2, 11], [3, 5], . . . , then $$h_1^1 \oplus h_2^1 = h_3^1 \oplus h_4^1 = h_5^1 \oplus h_6^1 = \ldots = K$$

in equations (19) or (20) is simply replaced by the condition $$h_1^1 \oplus h_7^1 = h_2^1 \oplus h_{11}^1 = h_3^1 \oplus h_5^1 = \ldots = K$$

If a 3-bit error exists in positions j, j+1 and l, wherein j∈{1, 3, 5, . . . ,}, then the following applies for the sub-syndrome $s_1$ $$s_1 = \alpha^{ij} \oplus \alpha^{ij+1} \oplus \alpha^{il} \quad (23)$$

and with $$\alpha^{ij} \oplus \alpha^{ij+1} = K \quad (24)$$

$$\alpha^{il} = s_1 \oplus K, \quad (25)$$

from which $$\alpha^{3(il)} = s_1^3 \oplus s_1 K^2 \oplus s_1^2 K \oplus K^3 \quad (26)$$

results.

For the sub-syndrome $s_3$ the following applies $$s_3 = \alpha^{3(ij)} \oplus \alpha^{3(ij+1)} \oplus \alpha^{3(il)} \quad (27)$$

$$= \alpha^{3(ij)} \oplus \alpha^{3(ij+1)} \oplus s_1^3 \oplus s_1 K^2 \oplus s_1^2 K \oplus K^3. \quad (28)$$

From equation (24) the following results $$\alpha^{3(ij+1)} = (K \oplus \alpha^{ij})^3 = K^3 \oplus K \alpha^{2(ij)} \oplus K^2 \alpha^{ij} \oplus \alpha^{3(ij)} \quad (29)$$

and from equation (28) for $\alpha^{ij}$ the following results $$s_1^3 \oplus s_3 \oplus s_1 K^2 \oplus s_1^2 K \oplus K \alpha^{2(ij)} \oplus K^2 \alpha^{ij} = 0. \quad (30)$$

Completely analog to that, for $\alpha^{ij+1}$ the following results $$s_1^3 \oplus s_3 \oplus s_1 K^2 \oplus s_1^2 K \oplus K \alpha^{2(ij+1)} \oplus K^2 \alpha^{ij+1} = 0. \quad (31)$$

so that $\alpha^{ij}$ and $\alpha^{ij+1}$ are solutions of the quadratic equation $$s_1^3 \oplus s_3 \oplus s_1 K^2 \oplus s_1^2 K \oplus K x^2 \oplus K^2 x = 0. \quad (32)$$

in the Galois field $GF(2^m)$.

It is thus possible to determine a 3-bit error containing a neighboring 2-bit error merely from knowing the syndrome components as $s_1$ and $s_3$, wherein for a 1-bit error the following applies $$s_1^3 = s_3 \text{ and } P = 1 \quad (33)$$

For a 2-bit error the following applies $$s_1^3 \neq s_3 \text{ and } P = 0 \quad (34)$$

and for a 3-bit error the following applies $$s_1^3 \neq s_3 \text{ and } P = 1. \quad (35)$$

The correction of a 3-bit error as a 3-bit error containing a neighboring 2-bit error may in particular be useful when 3-bit errors with neighboring 2-bit errors occur more frequently than 3-bit errors randomly distributed across the n bits, as it may be the case when the bits of binarily encoded data are stored in memory cells which store more than 1 bit per memory cell, for example 2 bits or 4 values per memory cell.

If only a subset of neighboring two-bit errors is to be corrected it is sufficient that a modified H-matrix $H^{mod}$ is determined in such a way that only for a subset of n' columns, where 4≤n'≤n applies, the corresponding columns $h_i^1$, 1≤i≤n' of the submatrix $H^{mod}$ are determined such that $$h_1^1 \oplus h_2^1 = h_3^1 \oplus h_4^1 = \ldots = h_{n'-1}^1 \oplus h_{n'}^1 = K$$

holds. Thereby K is no column of the submatrix $H_1^{mod}$.

It is not necessary that for the remaining n−n' columns of $H_1^{mod}$ this condition is valid.

Here the corresponding columns of the submatrix $H_1^{mod}$ are denoted by $h_1^1, h_2^1, h_3^1, \ldots, h_{n'}^1$. For any other n' columns a similar condition can be formulated.

If, for instance for n'=6 only the neighboring two-bit errors in the positions (5, 6), (9, 10) and (12, 13) together with a 1-Bit error in an arbitrary position has to be corrected, the submatrix $H_1^{mod}$ has to be determined such that we have $$h_5^1 \oplus h_6^1 = h_9^1 \oplus h_{10}^1 = \ldots = h_{12}^1 \oplus h_{13}^1 = K$$

where K is no column of the submatrix $H_1^{mod}$.

If, for example, only errors in the data bits have to be corrected, then the columns $h_1^1, h_2^1, h_3^1, \ldots, h_{n'}^1$ are columns of the submatrix $H_1^{mod}$ which correspond to data bits of the corrected word.

It may also be advantageous to correct 3-bit errors containing a neighboring 2-bit error as fast as possible and with a smallest possible hardware effort and to detect 3-bit errors which do not contain a neighboring 2-bit error as non-corrected or as not adequately corrected 3-bit errors. The H matrix $H^{mod}$ with $$H^{mod} = \begin{pmatrix} H_1^{mod} \\ H_3^{mod} \\ P \end{pmatrix}$$

and with $H_1(h_1^1, h_2^1, \ldots, h_n^1) = \alpha^{i_1}, \alpha^{i_2}, \ldots, \alpha^{i_n}$ may be supplemented by a further submatrix $H_5^{mod} = (\alpha^{5(i_1)}, \alpha^{5(i_2)}, \ldots, \alpha^{5(i_n)})$ into $$H^{mod} = \begin{pmatrix} H_1^{mod} \\ H_3^{mod} \\ H_5^{mod} \\ P \end{pmatrix} \quad (36)$$

The number of the checkbits may then be no more than 3m+1. It is possible that lines of the submatrix $H_5^{mod}$ are linearly dependent so that only the linearly independent lines of the matrix $H_5^{mod}$ are to be considered in the calculation of $s_5$. By the submatrix $H_5^{mod}$ then a further syndrome component $s_5$ is determined by $$s_5 = H_5^{mod} v' \quad (37)$$

which may include no more than m components.

If now the error correction of a 3-bit error is executed assuming a 3-bit error with a neighboring 2-bit error, then it may now be checked using the submatrix $H_5^{mod}$ whether the correction was executed properly. If the positions j, j+1 and l for a 3-bit error with a neighboring 2-bit error were determined merely on the basis of the syndrome components $s_1$ and $s_3$, then after the already executed error correction of the data word v' into the corrected word $v^{cor}$ it only remains to be checked whether the following applies for the corrected word $v^{cor}$ $$H_5^{mod} \cdot v^{cor} = H_5^{mod} \cdot (v' \oplus e) = 0 \quad (38)$$

If this relation is fulfilled, the 3-bit error was corrected properly. If this relation is not fulfilled, the 3-bit error is indicated as a non-correctly corrected 3-bit error.

Apart from that it is possible to detect 4-bit errors (and to differentiate same from a 2-bit error), as for a 4-bit error $$s_1^3 s_3 \oplus s_1 \cdot s_5 \oplus s_3^2 \oplus s_1^6 \neq 0, \text{and } P=0 \quad (39)$$

and for a 2-bit error $$s_1^3 s_3 \oplus s_1 \cdot s_5 \oplus s_3^2 \oplus s_1^6 = 0, P=0 \text{ and } s_1^3 \oplus s_3 \neq 0 \quad (40)$$

applies.

One further possibility to determine whether a corrected 3-bit error is a 3-bit error with a neighboring 2-bit error is to be described now.

For a 3-bit error in the bit positions j, l, r the following applies $$s_1 = \alpha^{ij} \oplus \alpha^{il} \oplus \alpha^{ir}, \quad (41)$$

$$s_3 = \alpha^{3ij} \oplus \alpha^{3il} \oplus \alpha^{3ir}, \quad (42)$$

$$s_5 = \alpha^{5ij} \oplus \alpha^{5il} \oplus \alpha^{5ir}, \quad (43)$$

If a neighboring 2-bit error exists in the positions j and l, then $\alpha^{ij} \oplus \alpha^{il} = K$ and thus $\alpha^{ir} = s_1 \oplus K$, so that the following applies $$s'_1 = \alpha^{ij} \oplus \alpha^{il} = s_1 \oplus \alpha^{ir} = K, \quad (44)$$

$$s'_3 = \alpha^{3ij} \oplus \alpha^{3il} = s_3 \oplus \alpha^{3ir} = s_3 \oplus s_1^3 \oplus s_1 K^2 \oplus K s_1^2 \oplus K^3, \quad (45)$$

$$s'_5 = \alpha^{5ij} \oplus \alpha^{5il} = s_5 \oplus \alpha^{5ir} = s_5 \oplus s_1^5 \oplus s_1 K^4 \oplus s_1^4 K \oplus K^5, \quad (46)$$

and the components $s'_1, s'_3, s'_5$ of the error syndrome describe a 2-bit error, so that $$s'_1{}^3 s'_3 \oplus s'_1 s'_5 \oplus s'_3{}^2 \oplus s'_1{}^6 = 0 \quad (47)$$

has to apply, from which using equations (44), (45) and (46) the following results for a 3-bit error with a neighboring 2-bit error $$s_1^6 \oplus s_3^2 \oplus s_1^5 K \oplus K s_5 \oplus K^3 s_3 \oplus K^3 s_1^3 = 0. \quad (48)$$

If this is originally a 3-bit error comprising no neighboring 2-bit error, the following applies $$s_1^6 \oplus s_3^2 \oplus s_1^5 K \oplus K s_5 \oplus K^3 s_3 \oplus K^3 s_1^3 \neq 0. \quad (48)$$

The possibilities of error detection now ought to be summarized again. First of all, the case is considered in which the overall parity P has not been determined.

1. For a 1-bit error the following applies:

$$s_1^3 = s_3.$$

2. For a 2-bit error the following applies:

$$s_1^3 \neq s_3,$$

$$s_1^3 s_3 \oplus s_1 s_5 \oplus s_3^2 \oplus s_1^6 = 0.$$

3. For a random 3-bit error the following applies:

$$s_1^3 \neq s_3,$$

$$s_1^3 s_3 \oplus s_1 s_5 \oplus s_3^2 \oplus s_1^6 \neq 0.$$

4. For a 3-bit error having a neighboring 2-bit error the following applies:

$$s_1^6 s_3^2 \oplus s_1^5 K \oplus K s_5 \oplus K^3 s_3 \oplus K^3 s_1^3 = 0.$$

Now the case is considered that the overall parity P has been determined.

1. For a 1-bit error the following applies:

$$s_1^3 = s_3,$$

$$P = 1.$$

2. For a 2-bit error the following applies:

$$s_1^3 \neq s_3,$$

$$P = 0.$$

3. For a random 3-bit error the following applies:

$$s_1^3 \neq s_3,$$

$$P = 1.$$

4. For a 3-bit error with a neighboring 2-bit error additionally the following applies:

$$s_1^6 \oplus s_3^2 \oplus s_1^5 K \oplus K s_5 \oplus K^3 s_1^3 \oplus K^3 s_1^3 = 0.$$

A 4-bit error may be differentiated from a 2-bit error in that for a 4-bit error the following applies $$s_1^3 \oplus s_1 \cdot s_5 \oplus s_3^2 \oplus s_1^6 \neq 0, \text{and } P=0$$

and for a 2-bit error $$s_1^3 \oplus s_1 \cdot s_5 \oplus s_3^2 \oplus s_1^6 = 0, \text{and } P=0$$

applies.

According to a possible aspect of the invention, the correction of 1-bit, 2-bit and 3-bit errors in binary data words is facilitated and in particular the error correction circuits required here can be improved so that a least possible hardware effort is required and the signal runtime for determining the correction values is as low as possible.

Apart from that or in addition, in a partial aspect of the invention, the error detection of non-correctable errors is to be enabled, in particular of non-correctable 3-bit errors.

According to another aspect of the invention, the error correction of any 1-bit errors, of any 2-bit errors, and of 3-bit errors containing a neighboring 2-bit error can be enabled in a simple way.

The invention is now to be explained with respect to embodiments.

FIG. 1a shows an inventive circuitry comprising a syndrome generator Synd 12 and a downstream decoder Dec 14. The syndrome generator Synd 12 comprises a n-bit wide input 11 for inputting an n digit binary word $v'=v'_1, \ldots, v'_n$ and m' binary outputs 13 for outputting an m' digit error syndrome s having two m digit sub-syndromes $s_1$ and $s_3$. The m' binary outputs 13 of the syndrome generator Synd 12 are connected to m' binary inputs of the decoder Dec 14 outputting an n digit correction vector $e=e_1, \ldots, e_n$ at its n digit output 15. Here, $m' \geq 2m$ and $n \leq 2^m - 1$ apply. The syndrome generator Synd 12 is here configured so that it outputs an m' component error syndrome at m' binary outputs when inputting the binary word v'. Here, s is determined according to the relation $$s = H^{mod} \cdot v'. \quad (50)$$

The matrix $H^{mod} = h'_1, \ldots, h'_n$ is an (m', n) matrix of n columns $h'_1, \ldots, h'_n$ each comprising m' components. 2m first components of these columns are designated by $h_1, \ldots, h_n$. For these 2m-component columns $h_j$ for $j=1, \ldots, n$ the following applies $$h_j = \begin{cases} \alpha^{ij} \\ \alpha^{3(i_j)} \end{cases} \quad (51)$$

Further, for n' being even for $j=1, 3, 5, \ldots, n'-1$ and for $n' \leq n$ for pairs of bits $[j, j+1]$ which are neighboring in the data word $v'=v'_1, \ldots, v'_n$ the H matrix H is determined so that the following applies $$\alpha^{ij} \oplus \alpha^{ij+1} = K. \quad (52)$$

Sub-syndromes $s_1, s_3$ are determined by $$s_1 = H_1^{mod} \cdot v' \quad (53)$$

$$s_3 = H_3^{mod} \cdot v', \quad (54)$$

wherein the (m, n) submatrices $H_1^{mod}$ and $H_3^{mod}$ are determined by $$H_1^{mod} = (\alpha^{i_1}, \ldots, \alpha^{i_n})$$

$$H_3^{mod} = (\alpha^{3(i_1)}, \ldots, \alpha^{3(i_n)}).$$

Here, α is an element of the Galois field $GF(2^m)$, which is an m-component binary vector in the vector representation, and the exponents of α are to be interpreted modulo $2^m - 1$. K is an m-digit binary vector equal to no column of the submatrix $H_1^{mod}$, i.e. for which $K \neq \alpha^{i_j}$ for $j=1, \ldots, n$ applies. Preferably, α is a primitive element of the Galois field $GF(2^m)$. If n is even n'=n may apply and for n being odd n'=n−1 may apply. For the simplicity of representation we describe the cases n'=n for n even and n'=n−1 for n odd.

To make the representation as easily understandable as possible, neighboring bits are here input at neighboring inputs each of the syndrome generator Synd 12, so that pairs of neighboring bits are described by the pairs [1, 2], [3, 4], [5, 6], . . . . It is of course also possible to exchange the bits $v'_1, v'_2, \ldots, v'_n$ of v', so that then a binary word $v^{verh} = v_{1(vert)}, \ldots, v_{n(vert)}$ results, wherein $$i(vert) = \pi(i)$$

applies and π(i) may describe a permutation π of the indices $1, \ldots, n$.

From the condition $\alpha^{ij} \oplus \alpha^{ij+1} = K$ after a permutation of the indices then simply the condition $\alpha^{\pi(i_j)} \oplus \alpha^{\pi(i_{j+1})} = K$ results.

If, for example, the first bit is not exchanged and the second bit is exchanged by the seventh bit, then instead of $\alpha^{i1} \oplus \alpha^{i2} = K$ now simply $\alpha^{i1} \oplus \alpha^{i7} = K$.

Further: if the data word $v' = v'_1, \ldots, v'_n$ is for example read out of a memory whose memory cells may store more than two states, for example three or four states, then those bits may be designated as neighboring bits which correspond to a state of a memory cell in the stored binary data word. In order not to make the description more complicated than necessary, pairs of neighboring bits are here described as pairs [1, 2], [3, 4], [5, 6], . . . . The data word $v' = v'_1, \ldots, v'_n$ may have resulted from errors of a code word v of a code with the H matrix $H^{mod}$. If no error exists, then v'=v and for the error syndrome s the following applies $s = H^{mod} \cdot v = 0$.

If an error exists, then $v' \neq v$ or $v' = v \oplus e$, wherein $e = e_1, \ldots, e_n$, as already described, which may be designated as an error vector. If v' and v are different by r bits, this is an r bit error. In this case, the corresponding r components of the error vector e are equal 1. All other components of the error vector are then equal 0.

The decoder Dec 14 is implemented so that
when an error syndrome s=0 is applied to its inputs, it outputs a correction vector e=0 at its output,
when an error syndrome s with sub-syndromes s1, s3 is applied to its input with $$s_1 = \alpha^{ij}, s_3 = \alpha^{3(ij)},$$

(and an odd number of bits is corrupted), it outputs $e_j = 1$ and $e_t = 0$ for $t \neq j$, when an error syndrome s with sub-syndromes s1, s3 is applied to its input with $$s_1 = \alpha^{ij} \oplus \alpha^{ir}, s_3 = \alpha^{3(ij)} \oplus \alpha^{3(ir)}$$

(and an even number of bits is corrupted), it outputs $e_j = 1$ and $e_r = 1$ and $e_t = 0$ for $t \neq j, r$, when an error syndrome s with sub-syndromes $s_1, s_3$ is applied to its input with $$s_1 = \alpha^{ij} \oplus \alpha^{ij+1} \oplus \alpha^{il}, s_3 = \alpha^{3ij} \oplus \alpha^{3ij+1} \oplus \alpha^{3il}$$

and with $\alpha^{ij} \oplus \alpha^{ij+1}$ wherein K is no column of the matrix $H_1^{mod}$ and an odd number of bits is corrupted, and for n being even $j \in \{1, 3, \ldots, n-1\}$ and for n being odd $j \in \{1, 3, \ldots, n-2\}$ apply, it outputs the bits $e_j = 1$, $e_{j+1} = 1$ and $e_l = 1$ and $e_t = 0$ for $t \neq j, j+1, l$ of the correction vector.

In order to determine whether an even or an odd number of bits has been corrupted, the overall parity $s_P = v'_1 \oplus \ldots \oplus v'_n$ of the data word v' may be used.

This may e.g. be done by the H matrix $H^{mod}$ now comprising m'=2m+1 lines and the columns $h'_1, \ldots, h'_n$ of the H matrix $H^{mod}$ being determined as $$h'_j = \begin{cases} \alpha^{ij} \\ \alpha^{3(ij)} \\ 1 \end{cases}$$

and the H matrix $H^{mod}$ having the form $$H^{mod} = \begin{pmatrix} H_1^{mod} \\ H_3^{mod} \\ P \end{pmatrix}$$

with $$P = \underbrace{(1, \ldots, 1)}_{n}.$$

A corresponding implementation of an inventive circuitry is illustrated in FIG. 1b. In FIG. 1b m'=2m+1 applies. The syndrome generator 12a comprises n binary inputs for inputting the data word v' and (2m+1) binary outputs fed to (2m+1) binary inputs of the decoder 14a and which carry the components $s_1$, $s_3$ and $s_P$. Here, $s_P$=0 when an even number of components of the data word are corrupted. $s_P$=1 applies when an odd number of components of the data word v' are corrupted. The data word v' is combined in an XOR circuit 16a component after component (i.e., component-wise) with the components of the correction vector $e=e_1, \ldots, e_n$ into $v^{cor}$, wherein $v^{cor}$ or is the corrected data word.

A further possibility to determine whether an even or an odd number of components or of bits has been corrupted in the data word v' may be to only select such columns $h_j^1$ for $j=1, \ldots, n$ as columns of the submatrix $H_1^{mod}$ which comprise an odd number of ones. In this case, the sub-syndrome $s_1 = s_{1_1}, \ldots, s_{1_m} = H_1^{mod} \cdot v'$ comprises an even number of bits has been corrupted in v' and comprises an odd number of ones when an odd number of bits has been corrupted in v', so that then for the parity $s_P$ the following applies $$s_P = s_{1_1} \oplus \ldots \oplus s_{1_m}$$

and the parity is determined from the sub-syndrome $s_1$ of the error syndrome.

In the circuitry of FIG. 1c m'=2m. The H matrix $H^{mod}$ is formed from the submatrices $H_1^{mod}$ and $H_3^{mod}$, wherein the submatrix $H_1^{mod}$ only comprises columns with an odd number of ones. The syndrome generator Synd 12b outputs the sub-syndromes $s_1$ and $s_3$ which are m bits wide each on its m'=2m bit wide output wherein the sub-syndromes are applied as input values to the 2m bit wide input of the decoder Dec 14b, which determines from the sub-syndrome $s_1$ by an XOR combination of the components of $s_1$ whether an odd or an even number of components are corrupted or not corrupted in v'.

In order to determine whether an even number or an odd number of components of the data word is corrupted, it is also possible to only select such columns as columns of the sub-matrix $H_3^{mod}$ which comprise an odd number of ones. In this case, the sub-syndrome $s_3 = s_{3_1}, \ldots, s_{3_m} = H_3^{mod} \cdot v'$ comprises an even number of ones when an even number of bits has been corrupted in v', and comprises an odd number of ones when an odd number of bits has been corrupted in v', so that the following then applies for the parity $s_P$ $$s_P = s_{3_1} \oplus \ldots \oplus s_{3_m}.$$

In order to determine whether an even number or an odd number of components of the data word is corrupted, it is further possible to select the columns of the H matrix $H^{mod}$ so that a certain subset of components of the columns which may both belong to $H_1^{mod}$ and also to $H_3^{mod}$ comprise an odd number of ones. From the corresponding components of the sub-syndromes $s_1$ and $s_3$ then again the parity $s_P$ may be determined by an XOR combination.

When the syndrome generator, apart from the syndrome components $s_1$ and $s_3$, outputs an additional syndrome component $s_P$ which forms the parity $s_P = v'_1 \oplus \ldots \oplus v'_n$, then the parity $s_P$ is provided as an input value at the input of the decoder Dec 14a. If the parity $s_P$ may be determined from components of the syndrome $s=s_1$, $s_3$, for example from the components of $s_1$ by XOR-ing, then the parity $s_P$ may be determined internally by the decoder, for example by a simple XOR combination of components of the error syndrome.

The decoder Dec 14, 14a, 14b may be implemented as follows. The decoder Dec 14a may comprise m'=2m+1 inputs which are downstream from the 2m+1 outputs of the syndrome generator Syn 12a—when the parity $s_P$ is directly provided by the syndrome generator—which carry the components of the error syndrome $s=s_1, s_3, s_P$, or the decoder Dec 14b may comprise m'=2m inputs connected to the 2m outputs of the syndrome generator Synd 12. n binary outputs of the decoder Dec 14, 14a, 14b are provided for outputting n binary correction values $e_1, \ldots, e_n$ for correcting the corresponding bits $v'_1, \ldots, v'_n$ of the binary word v', wherein the correction values $e_1, \ldots, e_n$ are determined from the values of the error syndrome s and the binary vector K. The decoder Dec is configured so that in case of a 1-bit error or a 2-bit error in the data word v' it outputs a correction value $e_j$=1 at its j-th output for $j=1, \ldots, n$ when $$s_1^3 \oplus s_3 \oplus s_1^2 \alpha^{ij} \oplus s_1 \alpha^{2ij} = 0$$

and outputs a correction value $e_j$=0 at its j-th output when $$s_1^3 \oplus s_3 \oplus s_1^2 \alpha^{ij} \oplus s_1 \alpha^{2ij} \neq 0.$$

In case of a 3-bit error the decoder outputs a correction value $e_j$=1 at its j-th output for $j=1, \ldots, n$, when $$s_1^3 \oplus s_3 \oplus s_1^2 K \oplus s_1 K^2 \oplus K^2 \alpha^{ij} \oplus K \alpha^{2ij} = 0$$

or $$s_1 \oplus K = \alpha^{ij}$$

and in case of a 3-bit error it outputs a correction value $e_j$=0 at its j-th output for $j=1, \ldots, n$ when both $$s_1^3 \oplus s_3 \oplus s_1^2 K \oplus s_1 K^2 \oplus K^2 \alpha^{ij} \oplus K \alpha^{2ij} \neq 0$$

and also $$s_1 \oplus K \neq \alpha^{ij}$$

apply.

Here, $\alpha^{ij}$ forms the j-th column in the matrix $H_1^{mod}$.

FIG. 2a shows one possible implementation of an inventive decoder Dec 2. In FIG. 2a it is assumed that the syndrome generator like the syndrome generator Synd 12a in FIG. 1b outputs at its (2m+1) bit wide output an error syndrome $s=s_1, s_3, s_P$ which is applied to the corresponding input lines of the decoder 2. The decoder in FIG. 2a is set up from a subcircuit Dec 1 (21) and n further subcircuits $Dec2_1$ (221) ..., $Dec2_j$ (22j) ..., $Dec2_n$ (22n). The subcircuit Dec 1 (21) functions as an auxiliary subcircuit that is configured to form at least one auxiliary signal on the basis of the first syndrome portion $s_1$, the second syndrome portion $s_3$, and the identical column vector K. The n further subcircuits $Dec2_1$ (221) to $Dec2_n$ (22n) form a plurality of decoder subcircuits. Each decoder subcircuit $Dec2_1$ to $Dec2_n$ is associated to a specific bit of the binary word v'. Each decoder subcircuit $Dec2_1$ to $Dec2_n$ is configured for receiving the at least one auxiliary signal and for determining a corresponding correction value of the correction vector e. To this end, each decoder subcircuit $Dec2_j$ is configured to analyze the auxiliary signals "3-bit error", $(s_1^3 \oplus s_3)'$, $s_1^3 \oplus s_3 \oplus s_1 K^2 \oplus s_1^2 K$, and the first syndrome component $s_1$ with respect to the particular column vector $h_j = \alpha^{t_j}$ of the parity matrix $H^{mod}$, wherein the column vector $h_j$ corresponds to the specific associated bit of the binary word v'. Typically, the plurality of decoder subcircuits comprises n decoder subcircuits, i.e., one decoder subcircuits for each bit of the binary word v'. According to some embodiments it is nevertheless possible that less than n decoder subcircuits are present. The plurality of decoder subcircuits may also be called bit-related or bit-associated subcircuits. The plurality of decoder subcircuits $Dec2_1$ to $Dec2_n$ provide a parallel processing regarding the correction values $e_1$ to $e_n$, which is capable of providing for a fast and efficient determination of the error correction vector e. For instance, after circuit optimization by commercial synthesis tools, circuits can be jointly optimized.

The inputs of the decoder carrying the values of the sub-syndromes $s_1$, $s_3$, $s_P$ are directly connected to the 2m+1=m' inputs of the subcircuit Dec1 21 for forming the signals "3-bit error",
$(s_1^3 \oplus s_3)'$
$s_1^3 \oplus s_3 \oplus s_1 K^2 \oplus s_1^2 K$ which the subcircuit Dec1 21 provides at its outputs connected to corresponding three inputs each of the subcircuits $Dec2_j$ for j=1, . . . , n. On a fourth input of each of the subcircuits $Dec2_j$ the sub-syndrome $s_1$ is applied.

The 1-bit wide signal "3-bit error" indicates whether a 3-bit error exists. The m bit wide signal $(s_1^3 \oplus s_3)'$ for $(s_1, s_3) \neq 0$ is equal $s_1^3 \oplus s_3$ and for $$(s_1, s_3) = 0 \text{ equal } \underbrace{1, 0, \ldots, 0}_{m}.$$

The m bit wide value $s_1^3 \oplus s_3 \oplus s_1 K^2 \oplus s_1^2 K$ is determined by sub-syndromes $s_1$, $s_3$ and the constant vector K. The subcircuits $Dec2_j$ 22j output the correction value $e_j$ at their each 1 bit wide output.

Figure 2B:
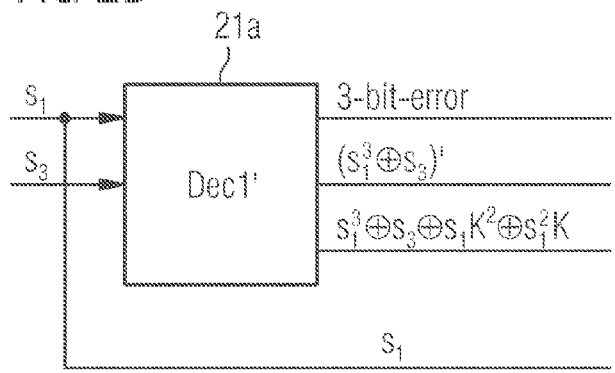
FIG. 2b shows a schematic block diagram of a subcircuit for forming auxiliary signals.

In FIG. 2b a subcircuit Dec1' 21a for forming the signals
3-bit error,
$(s_1^3 \oplus s_3)'$
$s_1^3 \oplus s_3 \oplus s_1 K^2 \oplus s_1^2 K$
is illustrated which outputs these signals at its outputs when the sub-syndromes $s_1$, $s_3$ are applied to its m'=2m bit wide input. It is assumed here that the parity $s_P$ is internally derived from the syndrome components $s_1$, $s_3$ by the subcircuit Dec1'. Otherwise, the subcircuit Dec1' fulfills the same function as the subcircuit Dec1 of FIG. 2a. The (auxiliary) subcircuit Dec1, Dec1' determines one or more auxiliary signals that are needed by several of the decoder subcircuits $Dec2_1$ to $Dec2_n$. Typically, the auxiliary signals provided by the subcircuit Dec1, Dec1' are used by all of the decoder subcircuits $Dec2_1$ to $Dec2_n$. In this manner, the proposed circuitry for the correction of errors is highly efficient because signals that are needed multiple times are generated only once and made available to the decoder subcircuits $Dec2_1$ to Dec2 for further use.

FIG. 3a shows a special implementation of the subcircuit Dec1 of FIG. 2a, wherein the parity $s_P$, as illustrated in FIG. 2a, is provided by the syndrome generator Synd 12a in FIG. 1b. The subcircuit Dec1 21 of the decoder Dec 2 in FIG. 2a in turn consists of, or comprises, a subcircuit 31 for determining the value $s_1^3 \oplus s_3$, a subcircuit 32 for determining the value $s_1^2 K \oplus s_2 K^2$, an OR circuit 33 with m inputs and one output, an AND gate 34 with two binary inputs and one output, a NOR circuit 35 with 2m inputs and one output, an XOR circuit 36 with two inputs which are each m bit wide and one m bit wide output and an XOR gate 37 with two 1 bit wide inputs and one 1 bit wide output.

The subcircuit 31 comprises two m bit wide inputs to which the sub-syndromes $s_1$ and $s_3$ are applied. It determines the value $s_1^3 \oplus s_3$ and outputs the same at its m bit wide output. If $s_1^3 = s_3$, then $s_1^3 \oplus s_3 = 0$. A realization of this circuit as a combinational circuit with a given function is of no difficulty for a person skilled in the art. For example, this subcircuit may be realized as a combinational circuit. It is for example possible to synthesize a combinational circuit with m inputs and m outputs for forming $s_1^3$ via a table of values of this function. The m outputs of this circuit may then be XOR-ed component after component with $s_3$.

The 2m bit wide input of the NOR circuit 35 is connected to the lines carrying the sub-syndromes $s_1$ and $s_3$. This circuit outputs the value 1 exactly when $s_1 = s_3 = 0$ and no error exists. The output of the NOR circuit 35 is fed to a first input of the XOR gate 37, whose second input is for example connected to the least significant bit of the m-digit output of the subcircuit 31 and whose output carries the least significant bit of the value $(s_1^3 \oplus s_3)'$. The m bit wide values $s_1^3 \oplus s_3$ and $(s_1^3 \oplus s_3)'$ differ by their least significant bit when $s_1 = s_3 = 0$. The value of the least significant bit of $(s_1^3 \oplus s_3)'$ in this case is equal 1, while the value of the least significant bit of $s_1^3 \oplus s_3$ is equal to 0. If $s_1, s_3 \neq 0$, then $s_1^3 \oplus s_3$ and $(s_1^3 \oplus s_3)'$ do not differ.

This is a special implementation which serves for $(s_1^3 \oplus s_3)' \neq 0$ when $s_1, s_3 = 0$, which may be achieved in different ways. For example, the XOR gate may be replaced by an OR gate. Likewise, the output signal of the NOR gate 35 may be combined with a more significant bit of the output of the subcircuit 31, or the output signal of the NOR gate 35 may be combined with several bits of the output of the subcircuit 31.

The m bit wide output of the subcircuit 31 is fed to the m bit wide input of the OR circuit 33, whose 1-bit wide output is connected to a first input of the AND gate 34 and whose second input is connected to the input carrying the parity signal $s_P$, and whose output carries the signal "3-bit error". This signal "3-bit error" is equal to 1, when both $s_1^3 \oplus s_3 \neq 0$ and $s_P = 1$.

The input carrying the sub-syndrome $s_1$ is further connected to the m bit wide input of the subcircuit 32 for determining the value $s_1^2 K \oplus s_1 K^2$, whose m bit wide output is fed to a 2m bit wide first input of the XOR circuit 36, whose second m bit wide input is connected to the output of the subcircuit 31 and which outputs the signal $s_1^3 \oplus s_3 \oplus s_1^2 K \oplus s_1 K^2$ at its output.

In FIG. 3b an embodiment for realizing the subcircuit Dec1' 21a of the FIG. 2b is illustrated in which in contrast to the subcircuit Dec1 21 the parity signal $s_P$ is not provided at the input of the subcircuit but derived from the sub-syndrome $s_1$. It is assumed here that the columns of the submatrix $H_1$ each comprise an odd number of ones.

The circuit parts of FIG. 3b, which are not different from the corresponding circuit parts of FIG. 3a, are designated by the same reference numerals and are not to be described again here. In FIG. 3b, the input of the subcircuit 21a carrying the sub-syndrome $s_1$ is connected to the m bit wide input of an XOR circuit 38 with m inputs and one binary output which outputs the value $s_P = s_{1_i} \oplus \ldots s_{1_m}$ at its output.

In FIG. 3c one possible realization of the subcircuit Dec1″ 21b is represented which in addition to the outputs of the subcircuit of FIG. 3a comprises further outputs for outputting signals "1-bit error", "2-bit error", and "3-bit error". The circuit parts of FIG. 3b, which are not different from the corresponding circuit parts of FIG. 3a, are designated by the same reference numeral and are not to be described again here. The input carrying the parity signal $s_P$ is additionally connected to a first input of an AND gate 310 having two inputs and one output and invertedly (e.g., via an inverter) connected with a first input of a further AND gate 39 having two inputs and one output. The output of the OR circuit 33 is additionally connected to the second input of the AND gate 39 and invertedly connected with the second input of the AND gate 310 carrying the signal "1-bit error" at its output. The AND gate 39 outputs the signal "2-bit error" at its output.

FIG. 4 shows one possible realization of a subcircuit $Dec2_j$ 22j of FIG. 2a.

To the 1-bit wide input 410 connected to a control input of a multiplexer 44, the binary signal "3-bit error" is applied, which takes on the value 1 when a 3-bit error exists and takes on the value of 0 when no 3-bit error exists.

To the m bit wide input 411 connected to a first m bit wide input of an XOR circuit 42, the signal $(s_1^3 \oplus s_3)'$ is applied.

To the m bit wide input 412, connected to a first m bit wide input of an XOR circuit 45, the signal $s_1^3 \oplus s_3 \oplus s_1 K^2 \oplus s_1^2 K$ is applied. To the second m bit wide input of the XOR circuit 45, the constant value $K\alpha^{2ij} \oplus K^2 \alpha^{ij}$ is applied. This constant value $K\alpha^{2ij} \oplus K^2 \alpha^{ij}$ is determined by the (first or upper) portion $h_j^1 = \alpha^{ij}$ of the column vector $h_j$ of the matrix $H^{mod}$ so that it is different for each individual decoder subcircuit $Dec2_j$. In other words, the portion $h_j^1 = \alpha^{ij}$ of the column vector $h_j$ acts as a parameter, or parameterizes, the decoder subcircuit $Dec2_j$. The output of the XOR circuit 45 is fed to the m bit wide input of an NOR circuit 47 having m binary inputs and one binary output connected to a first input of an OR gate 47 and whose 1-bit wide output is guided into the 1-input of the multiplexer 44.

To the m bit wide input 413 which is at the same time connected to the m bit wide input of a subcircuit 41 for realizing the function $s_1 \alpha^{2i} \oplus s_1^2 \alpha^i$ and an m bit wide first input of an XOR circuit 48, the m bit wide value of the sub-syndrome $s_1$ is applied. The function $s_1 \alpha^{2i} \oplus s_1^2 \alpha^i$ is parameterized by the portion $h_j^1 = \alpha^{ij}$ of the column vector $h_j$ that corresponds to the j-th bit of the binary word v'.

The m bit wide output of the subcircuit 41 is connected to the second m bit wide input of the XOR circuit 42 whose m bit wide output is guided into the m bit wide input of NOR circuit 43, whose 1-bit wide output is connected to the 0 input of the multiplexer 44 which outputs the correction value $e_j$ at its output 41.

To the second m bit wide input of the XOR circuit 48 the constant value $K \oplus \alpha^{ij}$ (parameterized by $h_j^1 = \alpha^{ij}$) is applied. The m bit wide output of the XOR circuit 48 is connected to an m bit wide input of the NOR circuit 49 whose 1-bit wide output is connected to the second input of the OR gate 46.

It is obvious that a person skilled in the art may optimize the subcircuit $Dec2_j$ of FIG. 4. As examples for possibilities of optimizing shall be stated:

Using the XOR circuit 45 the m digit value $s_1^3 \oplus s_3 \oplus s_1 K^2 \oplus s_1^2 K$ applied to the input 412 is XOR-ed component after component with the constant m digit binary vector $K\alpha^{2ij} \oplus K^2 \alpha^{ij}$. Exactly for those components of the binary vector $K\alpha^{2ij} \oplus K^2 \alpha^{ij}$ which are equal to 1, the corresponding components of $s_1^3 \oplus s_3 \oplus s_1 K^2 \oplus s_1^2 K$ are inverted while those components for which the components of the binary vector $K\alpha^{2ij} \oplus K^2 \alpha^{ij}$ are equal to 0 are not inverted. An optimum realization may simply be for the input 412 being connected via corresponding inverters to the m-component input of the NOR circuit 46 for which the function of the XOR circuit 45 may be realized.

By means of the XOR circuit 48 the constant value $K \oplus \alpha^{ij}$ is XOR-ed component after component with the m-component sub-syndrome $s_1$ applied to the input 413. Functionally equivalent here is a connection of the m input lines of the input 413 to the m binary inputs of the NOR circuit 49 via inverters, while inverters are upstream of inputs of the NOR circuit 49 which are inverted by the constant vector $K \oplus \alpha^{ij}$, i.e. for which the corresponding components of this vector are equal to 1.

As already discussed, it is possible, in addition to the syndrome components $s_1$ and $s_3$ determined by $s_1 = H_1^{mod} \cdot v'$ and $s_3 = H_3^{mod} \cdot v'$ to use a further syndrome component $s_5 = H_5^{mod} \cdot v' = (\alpha^{5i_1}, \ldots, \alpha^{5i_n})$ to differentiate between 3-bit errors with neighboring 2-bit errors and other 3-bit errors which do not comprise neighboring 2-bit errors.

If the overall parity is considered, the used code comprises 3m+1 check bits.

If the used code comprises 3m+1 check bits it is now to be explained with reference to FIG. 1d how a difference may be made between 3-bit errors with neighboring 2-bit errors which are properly corrected according to the invention and 3-bit errors which do not comprise neighboring 2-bit errors and which are not properly corrected.

For an error correction of 1-bit, 2-bit and 3-bit errors with neighboring 2-bit errors, in FIG. 1d only the all in all (2m+1) bit wide syndrome components $s_1$, $s_3$ and $s_P$ are used which correspond to the (2m+1) first check bits, although the code comprises more than 2m+1 and a maximum of 3m+1 check bits, wherein further check bits are not used for the correction and only serve to determine whether the correction was executed correctly.

This may be advantageous to realize the correction in a most simple way, which may manifest itself in a relatively limited area requirement of the correction circuit and a relatively fast correction.

Accordingly, the syndrome generator Synd 12c only outputs the (2m+1) bit wide syndrome components $s_1$, $s_3$, $s_P$ at its output, which is connected to the input of the decoder Dec 14c and the syndrome generator Synd 12c has a (2m+1) digit output connected to the (2m+1) bit wide input of the decoder Dec 14c. From the syndrome components $s_1$, $s_3$, $s_P$ the decoder Dec 14c forms the n-component correction vector $e = e_1, \ldots, e_n$ which is combined component-wise with the data word v' into $v^{cor}$ in the XOR circuit 16c and is output at the output of the XOR circuit 16c. The output of the XOR circuit 16c is apart from that guided into the m bit wide input of an error indication circuit 17c which outputs an error signal $q = q_2$ when the error was corrected properly and which outputs an error signal $q = q_1 \neq q_2$ when the error was not properly corrected. The error indication circuit may for example form an error signal q with $$q = s'_{5_1} \vee \ldots \vee s'_{5_m} \quad (55)$$

from the components $s'_{5_1}, \ldots, s'_{5_m}$ of the sub-syndrome $s'_5$ with $$s'_5 = H_5^{mod} \cdot v^{cor} = (\alpha^{5i_1}, \ldots, \alpha^{5i_n}) \cdot v^{cor} \quad (56)$$

and output an error signal $q_1 = 1$ when $s'_5 \neq 0, \ldots, 0$. If $q = q_1 = 1$, a 3-bit error exists which contains no neighboring 2-bit error and which has not been corrected properly. $q = q_2 = 0$ is output when $s'_5 = 0, \ldots, 0$. A 3-bit error exists then which contains a neighboring 2-bit error and which has been corrected properly. The error signal E(3-bit error) is a component-wise XOR combination of the components $s'_{5_1}, \ldots, s'_{5_m}$ of the sub-syndrome $s_5$. Of course, an error signal $q=q_2=0$ is also output when no error exists and $s=0$, or a 1-bit error or a 2-bit error has been corrected properly.

It is also possible to combine only a subset of the components of the sub-syndrome $s'_5$ by OR operations into an error signal q. This is particularly useful when lines of the matrix $H_5^{mod}$ are linearly dependent or equal to 0. It is also possible to form an error signal $q=F(s'_{5_i}, \ldots, s'_{5_m})$ wherein F may be a linear or non-linear Boolean function with $F(0, \ldots, 0)=0$.

A neighboring 2-bit error here is always a neighboring 2-bit error occurring at the described positions [1, 2], [3, 4], [5, 6], . . . .

A further possibility to differentiate 3-bit errors containing no neighboring 2-bit errors and which may not be corrected properly from 3-bit errors containing neighboring 2-bit errors which may be corrected properly using a syndrome component $s_5$ is to be disclosed now.

The used code for example again comprises (3m+1) check bits when the overall parity is considered and it comprises (3m) check bits when the overall parity is not considered.

FIG. 1e illustrates an inventive circuit comprising a syndrome generator Synd 12d forming an error syndrome $s=s_1$, $s_3$, $s_5$, $s_P$ according to a matrix $H^{mod}$ $$H^{mod} = \begin{pmatrix} H_1^{mod} \\ H_3^{mod} \\ H_5^{mod} \\ P \end{pmatrix}$$

and outputs same at the output of the syndrome generator Synd 12d connected to the input of the decoder Dec 14d.

The decoder Dec 14d comprises signals for error indication. The signals for error indication may include a signal which indicates whether a 3-bit error exists and they may include a signal which indicates whether a 3-bit error with a neighboring 2-bit error exists which may be corrected properly or may not be corrected properly.

Figure 2C:
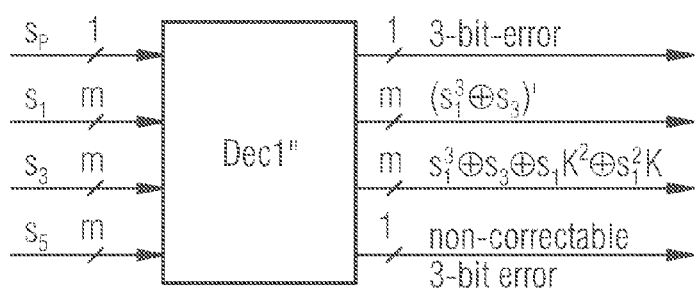
FIG. 2c shows a schematic block diagram of another subcircuit for forming auxiliary signal.

FIG. 2c shows a subcircuit Dec1" 21b with a first m bit wide input for inputting the sub-syndrome $s_1$, a second m bit wide input for inputting the sub-syndrome $s_3$, a third m bit wide input for inputting the sub-syndrome $s_5$ and a fourth 1-bit wide input for inputting the sub-syndrome $s_P$ and a first 1-bit wide output for outputting the signal "3-bit error", a second m bit wide output for outputting the value $(s_1^3 \oplus s_3)'$, a further m bit wide output for outputting the signal $s_1^3 \oplus s_3 \oplus s_1 K^2 \oplus s_1^2 K$ and a further 1-bit wide output for outputting a signal "non-correctable 3-bit error".

The signal "non-correctable 3-bit error" is equal to 1 when $$s_1^6 \oplus s_3^2 \oplus s_1^5 K \oplus s_1^3 K^3 \oplus K s_5 \oplus K^3 s_3 \neq 0 \quad (57)$$

applies.

A direct implementation of the function described in equation (56) may indicate whether a non-corrected 3-bit error exists.

Some modifications are still to be noted.

It is thus possible, instead of the syndrome component $s'_5 = s'_{5_1}, \ldots, s'_{5_m} = H_5^{mod} v^{cor}$ to implement only a subset of the syndrome components $s'_{5_i}, \ldots, s'_{5_m}$ if it sufficient to detect with a certain probability that a correctable or non-correctable 3-bit error exist.

It is also possible to for example (linearly or non-linearly) compact the m components $s'_{5_i}, \ldots, s'_{5_m}$ into $m^* < m$ components.

A special possibility of reducing the effort of the decoder is still to be noted.

If a 3-bit error exists containing a neighboring 2-bit error then in case of a correctable 3-bit error the correction always takes place in two subsequent bits $i_j$ and $i_{j+1}$, so that the subsequent correction values $e_{i_j}$ and $e_{i_{j+1}}$ are always equal in case of a correctable 3-bit error.

Then the terms $$s_1^3 \oplus s_3 \oplus s_1 K^2 \oplus s_1^2 K \oplus K\alpha^{2ij} \oplus K^2 \alpha^{ij}$$

and $$s_1^3 \oplus s_3 \oplus s_1 K^2 \oplus s_1^2 K \oplus K\alpha^{2ij+1} \oplus K^2 \alpha^{ij+1}$$

are always both equal to 1 or equal to 0.

This facilitates saving an m-input NOR circuit 47 in FIG. 4 for every second correction value, as the output of this NOR circuit may likewise be used as the output of the corresponding NOR circuit both in the subcircuit $22i_j$ and also in the subcircuit $22i_{j+1}$.

It is further clear that the subcircuits $22i$, $i=1, \ldots,$ n can be optimized together by one synthesis tool.

In the following, with reference to examples, the determination of the H matrix is to be shown.

As an example $m=4$ and the Galois field $GF(2^4)$ are selected. Common representations of the elements of the Galois field $GF(2^4)$ in the exponent representation, the polynomial representation and the vector representation with the modular polynomial $m(x)=1+x+x^4$ are given in table 1.

Table 1 shows the known representations of the elements of the $GF(2^4)$ in the exponent representation $\alpha^0, \alpha^1, \ldots, \alpha^{14}$ and 0, in the polynomial representation as 16 polynomials $p(x) = a_0 + a_1 x + a_2 x^2 + a_3 x^3$ of a degree less or equal 3 with the polynomial variables x and as 4-digit binary vectors whose components are the coefficients of the corresponding polynomials. The modular polynomial of the Galois field is $m(x)=1+x+x^4$.

It may thus be seen from table 1 that the element $p(x)=1$ (in the polynomial representation) and the binary vector 1, 0, 0, 0 (in the vector representation) corresponds to the element $\alpha^0$ (in the exponential representation), as it is described in the first line. It may be gathered from the third line that the representations $p(x)=x$ and 0, 1, 0, 0 correspond to $\alpha^1$.

As it is known, the addition of two elements in the vector representation is executed as a component-wise addition modulo 2 of the components.

TABLE 1

Elements of the $GF(2^4)$ generated by the primitive modular polynomial $m(x) = 1 + x + x^4$ in different forms of representation:

| Exponential Representation | Polynomial Representation | Vector Representation |
|---|---|---|
| 0 | 0 | (0000) |
| $\alpha^0$ | 1 | (1000) |
| $\alpha^1$ | x | (0100) |
| $\alpha^2$ | $x^2$ | (0010) |
| $\alpha^3$ | $x^3$ | (0001) |
| $\alpha^4$ | $1 + x$ | (1100) |
| $\alpha^5$ | $x + x^2$ | (0110) |
| $\alpha^6$ | $x^2 + x^3$ | (0011) |

TABLE 1-continued

Elements of the GF($2^4$) generated by the primitive modular polynomial $m(x) = 1 + x + x^4$ in different forms of representation:

| Exponential Representation | Polynomial Representation | Vector Representation |
|---|---|---|
| $\alpha^7$ | $1 + x + x^3$ | (1101) |
| $\alpha^8$ | $1 + x^2$ | (1010) |
| $\alpha^9$ | $x + x^3$ | (0101) |
| $\alpha^{10}$ | $1 + x + x^2$ | (1110) |
| $\alpha^{11}$ | $x + x^2 + x^3$ | (0111) |
| $\alpha^{12}$ | $1 + x + x^2 + x^3$ | (1111) |
| $\alpha^{13}$ | $1 + x^2 + x^3$ | (1011) |
| $\alpha^{14}$ | $1 + x^3$ | (1001) |

The addition in the polynomial representation is done by XOR-ing the corresponding coefficients of the powers or potencies of the polynomial variables.

The multiplication of two elements $\alpha^i$ and $\alpha^j$ results in the element $\alpha^k$ with $k = i+j$ modulo $(2^m - 1) = i + j$ modulo 15. The multiplication of two polynomials $p_1(x)$ and $p_2(x)$ in the polynomial representation results in the polynomial $p_3(x)$ with $p_3(x) = p_1(x) \cdot p_2(x)$ modulo $m(x)$ wherein $m(x)$ is the modular polynomial of the Galois field.

In the Galois field GF($2^4$) there are 15 different columns $$h_1, \ldots, h_{15} = \begin{pmatrix} \alpha^0 & \alpha^1 & \alpha^2 & \ldots & \alpha^{14} \\ \alpha^0, & \alpha^3, & \alpha^6, & \ldots, & \alpha^{12} \end{pmatrix}$$

If the length of the code is to be n=14, then from these columns for example the column $[\alpha^{12}, \alpha^6]^T$ with $$\alpha^{12} = \begin{pmatrix} 1 \\ 1 \\ 1 \\ 1 \end{pmatrix} = [1, 1, 1, 1]^T = K$$

may be deleted. An inventive H matrix $$H^{mod} = (h_1, \ldots, h_{14}) = \begin{pmatrix} \alpha^{j_1}, & \alpha^{j_2}, & \alpha^{j_3}, & \ldots, & \alpha^{j_{14}} \\ \alpha^{3j_1}, & \alpha^{3j_2}, & \alpha^{3j_3}, & \ldots, & \alpha^{3j_{14}} \end{pmatrix}$$

$$H_1^{mod} = (\alpha^{j_1}, \alpha^{j_2}, \alpha^{j_3}, \ldots, \alpha^{j_{14}})$$

and $$H_3^{mod} = (\alpha^{3j_1}, \alpha^{3j_2}, \alpha^{3j_3}, \ldots, \alpha^{3j_{14}})$$

may now be formed so that the component-wise XOR sum of the first four components of the pairs of the neighboring columns [1, 2], [3, 4], [5, 6], [7, 8], [9, 10], [11, 12], [13, 14] is each equal to $K = [1, 1, 1, 1]^T$. The first four components of a column of the matrix $H^{mod}$ here correspond to a column of $H_1^{mod}$. Thus, a matrix $$H^{mod} = \begin{pmatrix} \alpha^0 & \alpha^{11} & \alpha^1 & \alpha^{13} & \alpha^2 & \alpha^7 & \alpha^3 & \alpha^{10} & \alpha^4 & \alpha^6 & \alpha^5 & \alpha^{14} & \alpha^8 & \alpha^9 \\ \alpha^0 & \alpha^3 & \alpha^3 & \alpha^9 & \alpha^6 & \alpha^6 & \alpha^9 & \alpha^0 & \alpha^{12} & \alpha^3 & \alpha^0 & \alpha^{12} & \alpha^9 & \alpha^{12} \end{pmatrix} \quad (58)$$

$$= \begin{pmatrix} 1 & 0 & 0 & 1 & 0 & 1 & 0 & 1 & 1 & 0 & 0 & 1 & 1 & 0 \\ 0 & 1 & 1 & 0 & 0 & 1 & 0 & 1 & 1 & 0 & 1 & 0 & 0 & 1 \\ 0 & 1 & 0 & 1 & 1 & 0 & 0 & 1 & 0 & 1 & 1 & 0 & 1 & 0 \\ 0 & 1 & 0 & 1 & 0 & 1 & 1 & 0 & 0 & 1 & 0 & 1 & 0 & 1 \\ - & - & - & - & - & - & - & - & - & - & - & - & - & - \\ 1 & 0 & 0 & 0 & 0 & 0 & 0 & 1 & 1 & 0 & 1 & 1 & 0 & 1 \\ 0 & 0 & 0 & 1 & 0 & 0 & 1 & 0 & 1 & 0 & 0 & 1 & 1 & 1 \\ 0 & 0 & 0 & 0 & 1 & 1 & 0 & 0 & 1 & 0 & 0 & 1 & 0 & 1 \\ 0 & 1 & 1 & 1 & 1 & 1 & 1 & 0 & 1 & 1 & 0 & 1 & 1 & 1 \end{pmatrix}$$

can be determined.

The syndrome generator Synd implements the relations $$s = s_1, s_3 = s_{1_1}, s_{1_2}, s_{1_3}, s_{1_4}, s_{3_1}, s_{3_2}, s_{3_3}, s_{3_4} = H^{mod} \cdot (v'_1, \ldots, v'_{14})$$

or in a multiplied form $$s_{1_1} = v'_1 \oplus v'_4 \oplus v'_6 \oplus v'_8 \oplus v'_9 \oplus v'_{12} \oplus v'_{13},$$

$$s_{1_2} = v'_2 \oplus v'_3 \oplus v'_6 \oplus v'_8 \oplus v'_9 \oplus v'_{11} \oplus v'_{14},$$

$$s_{1_3} = v'_2 \oplus v'_4 \oplus v'_5 \oplus v'_8 \oplus v'_{10} \oplus v'_{11} \oplus v'_{13},$$

$$s_{1_4} = v'_2 \oplus v'_4 \oplus v'_6 \oplus v'_7 \oplus v'_{11} \oplus v'_{12} \oplus v'_{14},$$

$$s_{3_1} = v'_1 \oplus v'_8 \oplus v'_9 \oplus v'_{11} \oplus v'_{12} \oplus v'_{14},$$

$$s_{3_2} = v'_4 \oplus v'_7 \oplus v'_9 \oplus v'_{12} \oplus v'_{13},$$

$$s_{3_3} = v'_5 \oplus v'_6 \oplus v'_9 \oplus v'_{11} \oplus v'_{14},$$

$$s_{3_4} = v'_2 \oplus v'_3 \oplus v'_4 \oplus v'_5 \oplus v'_5 \oplus v'_7 \oplus v'_{10} \oplus v'_{12} \oplus v'_{13} \oplus v'_{14},$$

whose implementation presents no difficulty for a person skilled in the art for example using XOR gates.

If the overall parity $s_P$ is considered, then further $s_P = v'_1 \oplus \ldots \oplus v'_{14}$ is to be implemented.

Further, the matrix $H^{mod}$ may be supplemented by a submatrix $H_5^{mod}$, $$H_5^{mod}=(\alpha^{5i_1},\alpha^{5i_2},\alpha^{3i_3},\ldots,\alpha^{5i_{14}}).$$

The concrete form of the matrix $H_5^{mod}$ here is $$H_5^{mod}=(\alpha^1\alpha^8\alpha^{11}\alpha^{11}\alpha^8\alpha^{11}\alpha^1\alpha^{11}\alpha^1\alpha^1\alpha^8\alpha^6\alpha^8\alpha^1)$$

$$=\begin{pmatrix} 1 & 1 & 0 & 0 & 1 & 0 & 1 & 0 & 0 & 1 & 1 & 1 & 1 & 1 \\ 0 & 1 & 1 & 1 & 1 & 1 & 0 & 1 & 1 & 0 & 1 & 1 & 1 & 0 \\ 0 & 1 & 1 & 1 & 1 & 1 & 0 & 1 & 1 & 0 & 1 & 1 & 1 & 0 \\ 0 & 0 & 0 & 0 & 0 & 0 & 0 & 0 & 0 & 0 & 0 & 0 & 0 & 0 \end{pmatrix}.$$

The third line is equal to the second line and the fourth line is identical to 0, so that as additional syndrome components of $s_5=s_{5_1}, s_{5_2}, s_{5_3}, s_{5_4}$, in the implementation of the syndrome generator only the two syndrome components $$s_{5_1}=v'_1 \oplus v'_2 \oplus v'_5 \oplus v'_7 \oplus v'_{10} \oplus v'_{11} \oplus v'_{12} \oplus v'_{13} \oplus v'_{14},$$

$$s_{5_2}=v'_2 \oplus v'_3 \oplus v'_4 \oplus v'_5 \oplus v'_8 \oplus v'_9 \oplus v'_{11} \oplus v'_{12} \oplus v'_{13},$$

are to be implemented as an XOR circuit, as here $s_{5_3}=s_{5_2}$ and $s_{5_4}=0$ apply.

In the following it is to be indicated how the subcircuit 31 may be realized for realizing the function $s_1^3 \oplus s_3$.

It is possible to realize the function $y=s_1^3$ as a combinational circuit with m=4 binary inputs $s_{1_1}, s_{1_2}, s_{1_3}, s_{1_4}$ and m=4 binary outputs $y_1, y_2, y_3, y_4$. The outputs of this circuit are then XOR-ed component-wise with the syndrome components $s_{3_1}, s_{3_2}, s_{3_3}, s_{3_4}$.

A value table of the function $y=y_1, y_2, y_3, y_4=s_1^3$ is represented in table 2.

TABLE 2 value table $y = s_1^3$ in the $GF(2^4)$:

| $s_{1_1}$ | $s_{1_2}$ | $s_{1_3}$ | $s_{1_4}$ | $y_1$ | $y_2$ | $y_3$ | $y_4$ |
|---|---|---|---|---|---|---|---|
| 0 | 0 | 0 | 0 | 0 | 0 | 0 | 0 |
| 1 | 0 | 0 | 0 | 1 | 0 | 0 | 0 |
| 0 | 1 | 0 | 0 | 0 | 0 | 0 | 1 |
| 0 | 0 | 1 | 0 | 0 | 0 | 1 | 1 |
| 0 | 0 | 0 | 1 | 0 | 1 | 0 | 1 |
| 1 | 1 | 0 | 0 | 1 | 1 | 1 | 1 |
| 0 | 1 | 1 | 0 | 1 | 0 | 0 | 0 |
| 0 | 0 | 1 | 1 | 0 | 0 | 0 | 1 |
| 1 | 1 | 0 | 1 | 0 | 0 | 1 | 1 |
| 1 | 0 | 1 | 0 | 0 | 1 | 0 | 1 |
| 0 | 1 | 0 | 1 | 1 | 1 | 1 | 1 |
| 1 | 1 | 1 | 0 | 1 | 0 | 0 | 0 |
| 0 | 1 | 1 | 1 | 0 | 0 | 0 | 1 |
| 1 | 1 | 1 | 1 | 0 | 0 | 1 | 1 |
| 1 | 0 | 1 | 1 | 0 | 1 | 0 | 1 |
| 1 | 0 | 0 | 1 | 1 | 1 | 1 | 1 |

This table results from reading the corresponding exponential representation $\alpha^j$ for each of the 16 4-digit binary vectors $s_{1_1}, s_{1_2}, s_{1_3}, s_{1_4}$ which represent the vector representation of an element of the Galois field $GF(2^4)$, determining k=3j modulo 15 and reading the corresponding vector representation in the table for $\alpha^k$ which represents the binary value for $s_1^3=y_1, y_2, y_3, y_4$.

An implementation of a value table as a combinational circuit is no difficulty for a person skilled in the art.

One possible implementation of the subcircuit 32 for realizing the function $z=s_1^2 K \oplus s_1 K^2$ is to be described now. Here, $K=\alpha^{12}$ was selected as an example. In the polynomial representation $\alpha^{12}$ according to table 1 corresponds to the polynomial $K(x)=1+x+x^2+x^3$. The modular polynomial of the considered Galois field is $m(x)=1+x+x^4$. In the polynomial representation $s_1$ is represented by the polynomial $s_1(x)=s_{1_1}+s_{1_2}x+s_{1_3}x^2+s_{1_4}x^3$ and for $z(x)$ in the polynomial representation the following applies $$z(x)=(s_1(x)^2 \cdot K(x) \oplus s_1(x) \cdot K^2(x))\mod(1+x+x^4),$$

from which by a direct calculation for $z(x)=z_1+z_2x+z_3x^2+z_4x^3$ $$z(x)=(s_{1_1}+s_{1_4})+(s_{1_2}+s_{1_4})x+(s_{1_1}+s_{1_2}+s_{1_3}+s_{1_4})x^2+(s_{1_2}+s_{1_3})x^3$$

results.

The following applies $$z_1=s_{1_1}+s_{1_4}$$

$$z_2=s_{1_2}+s_{1_4}$$

$$z_3=s_{1_1}+s_{1_2}+s_{1_3}+s_{1_4}$$

$$z_4=s_{1_2}+s_{1_3},$$

wherein the additions are modulo 2 which logically correspond to an XOR combination. An implementation of the corresponding subcircuit for this embodiment is illustrated in FIG. 5.

Figure 5:
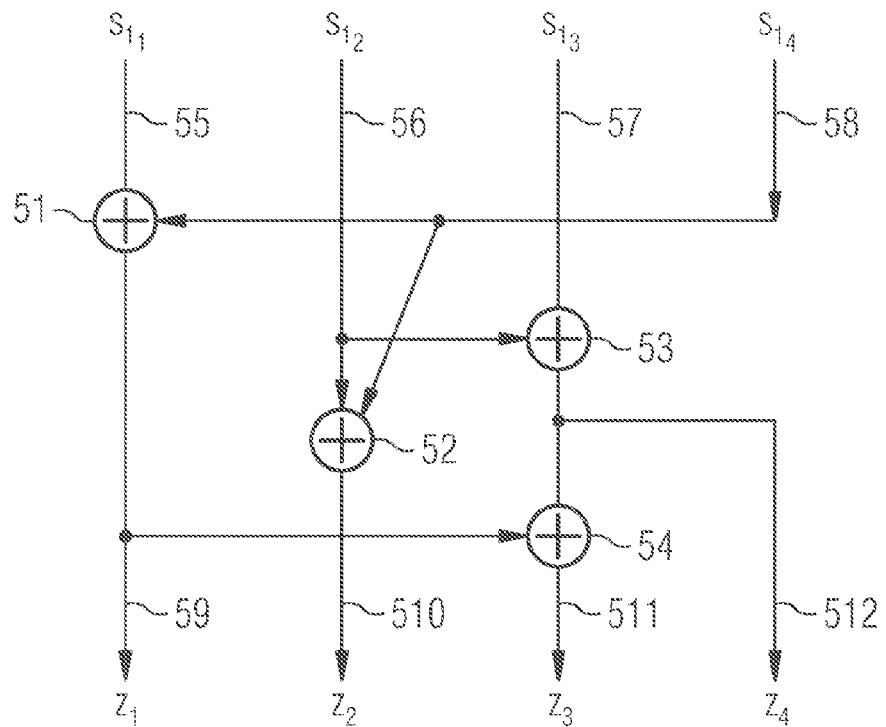
FIG. 5 shows a schematic implementation of a subcircuit for realizing the function $z = s_1^2 K \oplus s_1 K^2$.

The circuit of FIG. 5 comprises four binary inputs 55, 56, 57 and 58 carrying the values $s_{1_1}, s_{1_2}, s_{1_3}, s_{1_4}$ and four binary outputs 59, 510, 511 and 512 outputting the values $z_1, z_2, z_3$, and $z_4$ and four XOR gates 51, 52, 53 and 54 comprising two inputs and one output each. A first input of the XOR gate 51 is connected to the circuit input 55, while the second input of this gate is connected to the input 58. The output of the XOR gate 51 is connected both to the circuit output 59 and also to a first input of the XOR gate 54. The second input of the XOR gate 54 is connected to the output of the XOR gate 53 which is at the same time also connected to the output 512. The output of the XOR gate 54 is connected to the output 511.

A first input of the XOR gate 52 is connected to the input 56 which is at the same time also connected to a first input of the XOR gate 53. The second input of the XOR gate 52 is connected to the input 58. The second input of the XOR gate 53 is connected to the input 57. A first input of the XOR gate 52 is connected to the input 56 which is simultaneously also connected to a first input of the XOR gate 53. The second input of the XOR gate 52 is connected to the input 58. The output of the gate 52 is connected to the output 510. The second input of the XOR gate 53 is connected to the input 57.

Further, an example of a realization of the subcircuit 41 for realizing the function $u=s_1 \alpha^{2i_j} \oplus s_1^2 \alpha^{i_j}$ is to be described.

In the polynomial representation $s(x)$ is again represented as the polynomial $s_1(x)=s_{1_1}+s_{1_2}x+s_{1_3}x^2+s_{1_4}x^3$. As an example, $i_j=4$ is selected, i.e. for $\alpha^{i_j}, \alpha^4$ is selected. In the matrix $H_1^{mod}$ according to equation (58), $\alpha^4$ corresponds to the ninth column. It may be seen from table 1 that in the polynomial representation $\alpha^4$ corresponds to the polynomial $\alpha^4(x)=1+x$. For $u(x)$ thus $$u(x)=s_1(x) \cdot (1+x)^2+s_1(x)^2 \cdot (1+x)\mod(1+x+x^4),$$

results, from which by a direct calculation the following results $$u(x)=s_{1_4}+(s_{1_1}+s_{1_2}+s_{1_3})x+(s_{1_1}+s_{1_2})x^2+s_{1_4}x^3$$

and thus $$u_1=s_{1_4}$$

$$u_2=s_{1_1}+s_{1_2}+s_{1_3}$$

$u_3 = s_{1_1} + s_{1_2}$ $u_4 = s_{1_4}$

Here, the operation + in the addition of the polynomial coefficients is again to be interpreted modulo 2 and it corresponds to an XOR combination. A corresponding subcircuit for realizing the function $u = s_1 \cdot \alpha^8 + s_1^2 \cdot \alpha^4$ is illustrated in FIG. 6.

Figure 6:
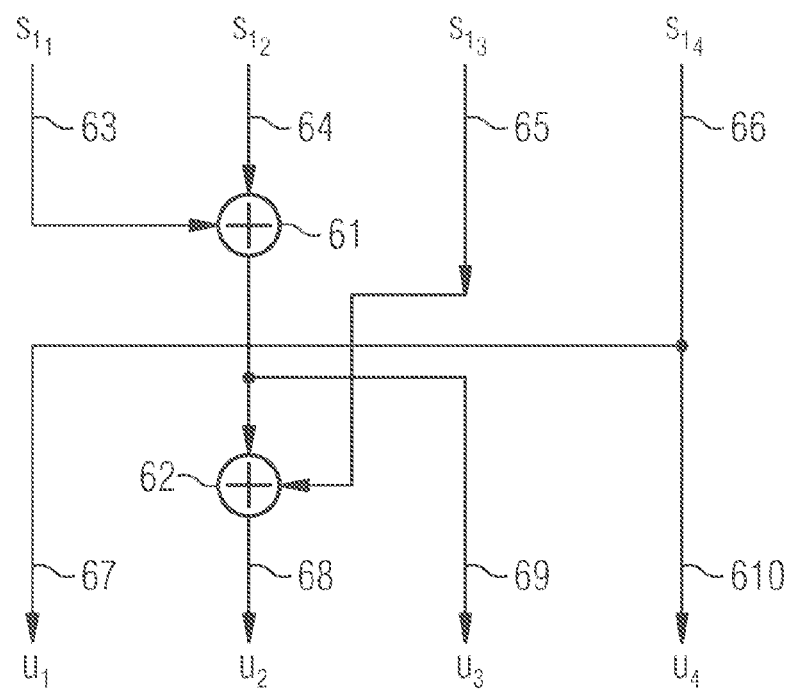
FIG. 6 shows a schematic implementation of a subcircuit for realizing the function $u = s_1 \cdot \alpha^8 + s_1^2 \cdot \alpha^4$.

The circuit of FIG. 6 comprises four inputs 63, 64, 65 and 66 at which the values $s_{1_1}$, $s_{1_2}$, $s_{1_3}$, and $s_{1_4}$ are input and four outputs 67, 68, 69 and 610 at which the values $u_1$, $u_2$, $u_3$, and $u_4$ are output. It comprises two XOR gates 61 and 62 with two inputs and one output each.

The input 63 is connected to a first input of the XOR gate 61 to whose second input the input 64 is connected. The output of the XOR gate 61 is connected to a first input of the XOR gate 62 and at the same time to the output 69. The input 65 is connected to the second input of the XOR gate 62 whose output is connected to the output 68. The input 66 is at the same time connected to the output 67 and to the output 610.

For the expression $K \cdot \alpha^{2i_j} \oplus K^2 \cdot \alpha^{i_j}$ for $K = \alpha^{12}$ and $i_j = 4$ $\alpha^{12} \cdot \alpha^8 \oplus \alpha^{24} \cdot \alpha^4 = \alpha^{20} \oplus \alpha^{28} = \alpha^5 \oplus \alpha^{13} = \alpha^7$ is obtained or in the polynomial representation according to table 1 the polynomial $1 + x + x^3$ or the vector representation (1101) is obtained.

In FIG. 4, $(s_1^3 \oplus s_3)' \oplus s_1 K^2 \oplus s_1^2 K$ for i=4 is functionally XOR-ed component-wise with the constant value $K\alpha^8 \oplus K^2 \alpha^4$ in the XOR circuit 45.

Practically, this combination may simply be done by inverting the first, the second and the fourth input of the NOR circuit 46 and not inverting the third input. Accordingly, it applies for $K = \alpha^{12}$ and $\alpha^{i_j} = \alpha^4$ that $\alpha^{12} \oplus \alpha^4 = \alpha^6$ or in the polynomial representation being equal $x^2 + x^3$. In the vector representation $\alpha^6 = (0, 1, 1, 0)$ applies. Thus, the component-wise XOR combination of $s_1$ and $K \oplus \alpha^{i_j}$ for $K = \alpha^{12}$ and $\alpha^{i_j} = \alpha^4$ in the XOR circuit 48 may be implemented by inverting the third and the fourth inputs of the NOR circuit 49 and the first and fourth inputs remaining non-negated.

In the following it is to be explained for one example how an H matrix $H^{mod}$ may be determined whose m first components of its columns always contain an odd number of ones. As an example here the Galois field $GF(2^5)$ with 32 elements is considered.

The different representations of the elements of the Galois field $GF(2^5)$ with the modular polynomial $m(x) = 1 + x^2 + x^5$ are represented in table 3.

A binary representation of non-modified submatrices $H_1$, $H_3$ and $H_5$ of an unshortened BCH code of the length 31 with $H_1 = (\alpha^0 \alpha^1 \ldots \alpha^{30})$, $H_3 = (\alpha^0 \alpha^3 \ldots \alpha^{3 \cdot 30})$, $H_5 = (\alpha^0 \alpha^5 \ldots \alpha^{5 \cdot 30})$, may be read in their concrete form directly from table 3.

TABLE 3

Elements of $GF(2^5)$ generated by the primitive modular polynomial $m(x) = 1 + x^2 + x^5$ in different forms of representation:

| Exponential Representation | Polynomial Representation | Vector Representation |
|---|---|---|
| 0 | 0 | (00000) |
| $\alpha^0$ | 1 | (10000) |
| $\alpha^1$ | x | (01000) |
| $\alpha^2$ | $x^2$ | (00100) |
| $\alpha^3$ | $x^3$ | (00010) |
| $\alpha^4$ | $x^4$ | (00001) |
| $\alpha^5$ | $1 + x^2$ | (10100) |
| $\alpha^6$ | $x + x^3$ | (01010) |
| $\alpha^7$ | $x^2 + x^4$ | (00101) |
| $\alpha^8$ | $1 + x^2 + x^3$ | (10110) |
| $\alpha^9$ | $x + x^3 + x^4$ | (01011) |
| $\alpha^{10}$ | $1 + x^4$ | (10001) |
| $\alpha^{11}$ | $1 + x + x^2$ | (11100) |
| $\alpha^{12}$ | $x + x^2 + x^3$ | (01110) |
| $\alpha^{13}$ | $x^2 + x^3 + x^4$ | (00111) |
| $\alpha^{14}$ | $1 + x^2 + x^3 + x^4$ | (10111) |
| $\alpha^{15}$ | $1 + x + x^2 + x^3 + x^4$ | (11111) |
| $\alpha^{16}$ | $1 + x + x^3 + x^4$ | (11011) |
| $\alpha^{17}$ | $1 + x + x^4$ | (11001) |
| $\alpha^{18}$ | $1 + x$ | (11000) |
| $\alpha^{19}$ | $x + x^2$ | (01100) |
| $\alpha^{20}$ | $x^2 + x^3$ | (00110) |
| $\alpha^{21}$ | $x^3 + x^4$ | (00011) |
| $\alpha^{22}$ | $1 + x^2 + x^4$ | (10101) |
| $\alpha^{23}$ | $1 + x + x^2 + x^3$ | (11110) |
| $\alpha^{24}$ | $x + x^2 + x^3 + x^4$ | (01111) |
| $\alpha^{25}$ | $1 + x^3 + x^4$ | (10011) |
| $\alpha^{26}$ | $1 + x + x^2 + x^4$ | (11101) |
| $\alpha^{27}$ | $1 + x + x^3$ | (11010) |
| $\alpha^{28}$ | $x + x^2 + x^4$ | (01101) |
| $\alpha^{29}$ | $1 + x^3$ | (10010) |
| $\alpha^{30}$ | $x + x^4$ | (01001) |

Here, the exponents of $\alpha$ are to be interpreted modulo 31. The following applies $$H_1 = \begin{pmatrix} 1 & 0 & 0 & 0 & 0 & 1 & 0 & 0 & 1 & 0 & 1 & 1 & 0 & 0 & 1 & 1 & 1 & 1 & 1 & 0 & 0 & 0 & 1 & 1 & 0 & 1 & 1 & 1 & 0 & 1 & 0 \\ 0 & 1 & 0 & 0 & 0 & 0 & 1 & 0 & 0 & 1 & 0 & 1 & 1 & 0 & 0 & 1 & 1 & 1 & 1 & 1 & 0 & 0 & 0 & 1 & 1 & 0 & 1 & 1 & 1 & 0 & 1 \\ 0 & 0 & 1 & 0 & 0 & 1 & 0 & 1 & 1 & 0 & 0 & 1 & 1 & 1 & 1 & 1 & 0 & 0 & 0 & 1 & 1 & 0 & 1 & 1 & 1 & 0 & 1 & 0 & 1 & 0 & 0 \\ 0 & 0 & 0 & 1 & 0 & 0 & 1 & 0 & 1 & 1 & 0 & 0 & 1 & 1 & 1 & 1 & 1 & 0 & 0 & 0 & 1 & 1 & 0 & 1 & 1 & 1 & 0 & 1 & 0 & 1 & 0 \\ 0 & 0 & 0 & 0 & 1 & 0 & 0 & 1 & 0 & 1 & 1 & 0 & 0 & 1 & 1 & 1 & 1 & 1 & 0 & 0 & 0 & 1 & 1 & 0 & 1 & 1 & 1 & 0 & 1 & 0 & 1 \end{pmatrix}$$

$$H_3 = \begin{pmatrix} 1 & 0 & 0 & 0 & 0 & 1 & 1 & 0 & 0 & 1 & 0 & 0 & 1 & 1 & 1 & 1 & 1 & 0 & 1 & 1 & 1 & 0 & 0 & 0 & 1 & 0 & 1 & 0 & 1 & 1 & 0 \\ 0 & 0 & 1 & 1 & 1 & 1 & 1 & 0 & 1 & 1 & 1 & 0 & 0 & 0 & 1 & 0 & 1 & 0 & 1 & 1 & 0 & 1 & 0 & 0 & 0 & 0 & 1 & 1 & 0 & 0 & 1 \\ 0 & 0 & 0 & 0 & 1 & 1 & 0 & 0 & 1 & 0 & 0 & 1 & 1 & 1 & 1 & 1 & 0 & 1 & 1 & 1 & 0 & 0 & 0 & 1 & 0 & 1 & 0 & 1 & 1 & 0 & 1 \\ 0 & 1 & 1 & 1 & 1 & 1 & 0 & 1 & 1 & 1 & 0 & 0 & 0 & 1 & 0 & 1 & 0 & 1 & 1 & 0 & 1 & 0 & 0 & 0 & 0 & 1 & 1 & 0 & 0 & 1 & 0 \\ 0 & 0 & 0 & 1 & 0 & 1 & 0 & 1 & 1 & 0 & 1 & 0 & 0 & 0 & 0 & 1 & 1 & 0 & 0 & 1 & 0 & 0 & 1 & 1 & 1 & 1 & 1 & 0 & 1 & 1 & 1 \end{pmatrix}$$

-continued $$H_5 = \begin{pmatrix} 1 & 1 & 1 & 1 & 0 & 1 & 0 & 0 & 0 & 1 & 0 & 0 & 1 & 0 & 1 & 0 & 1 & 1 & 0 & 0 & 0 & 0 & 1 & 1 & 1 & 0 & 0 & 1 & 1 & 0 & 1 \\ 0 & 0 & 0 & 1 & 0 & 0 & 1 & 0 & 1 & 0 & 1 & 1 & 0 & 0 & 0 & 0 & 1 & 1 & 1 & 0 & 0 & 1 & 1 & 0 & 1 & 1 & 1 & 1 & 1 & 0 & 1 \\ 0 & 1 & 0 & 1 & 1 & 0 & 0 & 0 & 0 & 1 & 1 & 1 & 0 & 0 & 1 & 1 & 0 & 1 & 1 & 1 & 1 & 1 & 0 & 1 & 0 & 0 & 0 & 1 & 0 & 0 & 1 \\ 0 & 0 & 0 & 1 & 1 & 1 & 0 & 0 & 1 & 1 & 0 & 1 & 1 & 1 & 1 & 1 & 0 & 1 & 0 & 0 & 0 & 0 & 1 & 0 & 0 & 1 & 0 & 1 & 0 & 1 & 1 & 0 \\ 0 & 0 & 1 & 1 & 0 & 1 & 1 & 1 & 1 & 1 & 0 & 1 & 0 & 0 & 0 & 1 & 0 & 0 & 1 & 0 & 1 & 0 & 1 & 1 & 0 & 0 & 0 & 0 & 1 & 1 & 1 \end{pmatrix}$$

As an example for K, here $K=\alpha^{24}$ is selected. It may be gathered from table 3 that in the polynomial representation $$K(x)=x+x^2+x^3+x^4$$

applies and in the vector representation (01111) applies.

To determine $H^{mod}$ now all columns of the H matrix are deleted which comprise an even number of ones in the components of $H_1$ and arrange the same so that the component-wise XOR combination of the pairs of columns of the submatrix $H_1$ in the bit positions [1, 2], [3, 4], [5, 6], . . . each results in $[0, 1, 1, 1, 1]^T$.

The submatrices $H_1^{mod}$, $H_3^{mod}$ and $H_5^{mod}$ of the matrix $H^{mod}$ obtained this way now are $$H_1^{mod} = \begin{pmatrix} 1 & 1 & 0 & 0 & 0 & 0 & 0 & 0 & 0 & 1 & 1 & 1 & 1 & 1 & 1 \\ 0 & 1 & 1 & 0 & 0 & 1 & 0 & 1 & 0 & 1 & 0 & 1 & 1 & 0 & 0 & 1 \\ 0 & 1 & 0 & 1 & 1 & 0 & 0 & 1 & 0 & 1 & 1 & 0 & 1 & 0 & 1 & 0 \\ 0 & 1 & 0 & 1 & 0 & 1 & 1 & 0 & 0 & 1 & 1 & 0 & 0 & 1 & 0 & 1 \\ 0 & 1 & 0 & 1 & 0 & 1 & 0 & 1 & 1 & 0 & 0 & 1 & 0 & 1 & 1 & 0 \end{pmatrix},$$

$$H_3^{mod} = \begin{pmatrix} 1 & 1 & 0 & 1 & 0 & 1 & 0 & 1 & 0 & 1 & 0 & 0 & 0 & 0 & 0 & 0 \\ 0 & 0 & 0 & 0 & 1 & 1 & 1 & 0 & 1 & 0 & 1 & 0 & 0 & 0 & 0 & 1 \\ 0 & 1 & 0 & 1 & 0 & 0 & 0 & 1 & 1 & 1 & 1 & 1 & 1 & 0 & 1 \\ 0 & 1 & 1 & 1 & 1 & 1 & 1 & 0 & 1 & 0 & 1 & 1 & 0 & 1 & 0 & 0 \\ 0 & 1 & 0 & 0 & 0 & 0 & 1 & 1 & 0 & 0 & 1 & 0 & 0 & 1 & 1 & 0 \end{pmatrix},$$

$$H_5^{mod} = \begin{pmatrix} 1 & 0 & 1 & 0 & 1 & 1 & 1 & 1 & 0 & 1 & 0 & 1 & 0 & 0 & 1 & 1 \\ 0 & 0 & 0 & 0 & 0 & 0 & 1 & 1 & 0 & 0 & 1 & 1 & 1 & 1 & 1 & 1 \\ 0 & 1 & 1 & 0 & 0 & 1 & 1 & 0 & 1 & 0 & 0 & 1 & 1 & 0 & 0 & 1 \\ 0 & 1 & 0 & 1 & 0 & 1 & 1 & 1 & 1 & 1 & 1 & 1 & 1 & 0 & 0 & 0 \\ 0 & 1 & 0 & 0 & 1 & 1 & 1 & 1 & 0 & 0 & 1 & 0 & 1 & 0 & 1 & 0 \end{pmatrix}$$

Here, all 16 columns of the submatrix $H_1$ were used which comprise an odd number of ones, so that the number of the columns of $H^{mod}$ is equal to 16.

It is now possible, as illustrated in FIG. 3b, to derive the overall parity as an XOR combination by the XOR circuit 38 from the sub-syndrome $s_1$ of the error syndrome s.

The functioning of the invention is now to be demonstrated first of all for the correction of a 2-bit error and subsequently for the correction of a 3-bit error with a neighboring 2-bit error. As an H matrix the H matrix $$H^{mod} = \begin{pmatrix} H_1^{mod} \\ H_3^{mod} \\ P \end{pmatrix}$$

is used which comprises 14 columns, wherein the columns of $H^{mod}$ and of $H_3^{mod}$ are elements of $GF(2^4)$ with the modular polynomial $m(x)=1+x+x^4$ and $K=\alpha^{12}=[1, 1, 1]^T$, as described in equation (58).

The binary word v' which is to be corrected is the word v'=(11010011100101). For the syndrome components $s_1$, $s_3$ and $s_P$ then the following applies $$s_1 = H_1^{mod} \cdot v' = \begin{pmatrix} 1 \\ 0 \\ 1 \\ 1 \end{pmatrix} = \alpha^{13},$$

$$s_3 = H_3^{mod} \cdot v' = \begin{pmatrix} 1 \\ 1 \\ 1 \\ 0 \end{pmatrix} = \alpha^{10},$$

$$s_P = P \cdot v' = (0),$$

as it may be directly recalculated using the H matrix according to equation (58).

As $s_P=0$ and $s \neq 0$, obviously a 2-bit error exists. The zeroes of the quadratic equation $s_1^3 \oplus s_3 \oplus s_1 \cdot x^2 \oplus s_1^2 \cdot x = 0$ are $\alpha^{11}$ and $\alpha^4$.

This may be checked easiest by putting in all possible values $\alpha^i$ for i=0, 1, . . . , 14.

In FIG. 2a, for each component $e_j$ a subcircuit $Dec2_{i,j}$, j=1, . . . , n, exists which then outputs a correction value $e_j=1$ when $\alpha^{ij}$ is the solution of equation $s_1^3 \oplus s_3 \oplus s_1 \cdot x^2 \oplus s_1^2 \cdot x = 0$. Solutions of this equation are $\alpha^4$ and $\alpha^{11}$.

FIG. 4 shows one possible implementation of a subcircuit $Dec2_{i,j}$. In the H matrix determined by equation (58) $\alpha^{i_2}=\alpha^{11}$ and $\alpha^{i_9}=\alpha^4$, so that $\alpha^{11}$ corresponds to the second and $\alpha^4$ the ninth column of the H matrix $H^{mod}$. In the data word v'=(11010011100101) thus the second and ninth bit positions are to be corrected so that with v'=(11010011100101) the error vector e=(01000000100000) has to be XOR-ed componentwise. The corrected word $v^{cor}$ is then $v^{cor}=$ (10010011000101). The components $e_2$ and $e_9$ are equal to 1, while all remaining components of the correction vector are equal to 0.

In order to explain the correction of a 3-bit error with a neighboring 2-bit error, as an example the correction of the data word v'=(10100011001101) is explained.

For the syndrome components now the following results $$s_1 = H_1^{mod} \cdot v' = \begin{pmatrix} 1 \\ 0 \\ 0 \\ 1 \end{pmatrix} = \alpha^{14}$$

$$s_3 = H_3^{mod} \cdot v' = \begin{pmatrix} 1 \\ 1 \\ 0 \\ 0 \end{pmatrix} = \alpha^4$$

$$s_P = P \cdot v' = (1)$$

As $S_P=1$ and $s_1^3=(\alpha^{14})^3=\alpha^{42}=\alpha^{12}\neq\alpha^4=s_3$ obviously a 3-bit error exist.

The following applies $$s_1 + K = \alpha^{14} \oplus \alpha^{12} = \begin{pmatrix}1\\0\\0\\1\end{pmatrix} \oplus \begin{pmatrix}1\\1\\1\\1\end{pmatrix} = \begin{pmatrix}0\\1\\1\\0\end{pmatrix} = \alpha^5$$

The zeros of the quadratic equation $$s_1^3 \oplus s_3 \oplus s_1 \cdot K^2 \oplus s_1^2 \cdot K \oplus K \cdot x^2 \oplus K^2 \cdot x$$

are $\alpha^1$ and $\alpha^{13}$, as it may be checked by directly recalculating.

In the H matrix determined by equation (58) $\alpha^{i11}=\alpha^5$, $\alpha^{i3}=\alpha^1$ and $\alpha^{i4}=\alpha^{13}$, so that $\alpha^5$ correspond to the eleventh column, $\alpha^1$ to the third column and $\alpha^{13}$ to the fourth column the H matrix determined by equation (58).

The data word v'=(10100011001101) is to be corrected in the third, the fourth and the eleventh bit position by combining the correction vector e=(00110000001000) componentwise with v' into v'⊕e=(10100011001101)⊕(00110000001000)=(10010011000101)=v$^{cor}$.

FIG. 7 shows a schematic flow diagram of a method for correcting errors in a possibly erroneous binary word v'=v'$_1$, ..., v'$_n$ relative to a codeword v=v$_1$, ..., v$_n$. The method comprises a step 902 for determining an error syndrome s=(s$_1$, s$_3$) of a modified BCH code with a H-matrix H$^{mod}$ comprising a first BCH submatrix H$_1^{mod}$ and a second BCH submatrix H$_3^{mod}$. The modified BCH code has a code distance d≥5. According to the modified BCH code, n' column vectors of the submatrix H$_1^{mod}$ are paired as column vector pairs so that a componentwise XOR combination of the two column vectors of each column vector pair produces an identical column vector K that is different from all column vectors of the BCH submatrix H$^{mod}$. The number n' is even and 4≤n'≤n applies. The second BCH submatrix H$_3^{mod}$ comprises a corresponding column vector for each column vector in the first BCH submatrix H$_1^{mod}$ so that the corresponding column vector is the third power, according to Galois field arithmetic, of the column vector in the first BCH submatrix H$_1^{mod}$. The error syndrome s is determined by multiplying the H-matrix H$^{mod}$ with the possibly erroneous binary word v' so that a first error syndrome portion is given by s$_1$=H$_1^{mod}$·v' and a second error syndrome portion is given by s$_3$=H$_3^{mod}$·v'.

The method further comprises a step 904 of generating the correction vector e=(e$_1$, ..., e$_n$) with correction values e$_j$=e$_{j+1}$=e$_l$=1 and e$_t$=0 for t≠j, j+1, l, if the following conditions are fulfilled:

s$_1$ equals the componentwise XOR combination of the identical column vector K and a column vector at a column position l of the first BCH submatrix H$_1^{mod}$, i.e., s$_1$=K⊕h$_l^1$; and s$_3$ equals the componentwise XOR combination of column vectors at column positions j, j+1, and l of the second BCH submatrix H$_3^{mod}$, i.e., s$_3$=h$_j^1$⊕h$_{j+1}^1$⊕h$_l^1$.

This means that the error syndrome s=(s$_1$, s$_3$) fulfills the following condition:

$$s_1=\alpha^{ij}\oplus\alpha^{ij+1}\oplus\alpha^{il}, s_3=\alpha^{3ij}\oplus\alpha^{3ij+1}\oplus\alpha^{3il}$$

In this manner, an adjacent 2-bit error in combination with a further 1-bit error (i.e., a 3-bit error in total) can be corrected. Moreover, the method for correcting errors typically also supports the correction of 1-bit errors and 2-bit errors (adjacent or not adjacent).

In case none of the conditions for a 1-bit error, a 2-bit error, or a 3-bit error containing an adjacent 2-bit error are fulfilled, all correction values e$_j$, j=1 ... n, are typically chosen to be zero, so that no correction of the binary word v' is performed. This typically means that no correctable error was detected: Either the binary word v' was error-free or it contains too many errors in order to be detected and/or corrected in an unambiguous manner.

It is possible that the bits of a word which are to be corrected are auxiliary binary read values of a ternary memory or a multiple-valued memory as it is described in the U.S. patent application Ser. No. 13/664,495, filed Oct. 31, 2012 and entitled "Circuit and Method for Multi-Bit Correction" which is included here in the description by reference in its entirety. The auxiliary binary read values are provided by a subcircuit LH in U.S. Ser. No. 13/664,495 on the basis of ternary (or multi-valued) state values of memory cells which are adapted to take on, at a particular time, one of at least three states. The subcircuit LH is called an "auxiliary read value generator" in the present disclosure. Hence, the technology of ternary or multi-valued memories may benefit from the powerful error correcting capabilities of BCH codes. Ternary memories or multi-valued memories are relatively prone to suffer from adjacent bit errors as a single memory cell influences two or more of the auxiliary binary read values.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding unit or item or feature of a corresponding apparatus.

The inventive decomposed signal can be stored on a digital storage medium or can be transmitted on a transmission medium such as a wireless transmission medium or a wired transmission medium such as the Internet.

Depending on certain implementation requirements, embodiments of embodiments can be implemented in hardware or in software. The implementation can be performed using a digital storage medium, for example a floppy disk, a DVD, a CD, a ROM, a PROM, an EPROM, an EEPROM or a FLASH memory, having electronically readable control signals stored thereon, which cooperate (or are capable of cooperating) with a programmable computer system such that the respective method is performed.

Some embodiments according to embodiments comprise a non-transitory data carrier having electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer. The program code may for example be stored on a machine readable carrier.

Other embodiments comprise the computer program for performing one of the methods described herein, stored on a machine readable carrier.

In other words, an embodiment of the inventive method is, therefore, a computer program having a program code for performing one of the methods described herein, when the computer program runs on a computer.

A further embodiment of the inventive methods is, therefore, a data carrier (or a digital storage medium, or a computer-readable medium) comprising, recorded thereon, the computer program for performing one of the methods described herein.

A further embodiment of the inventive method is, therefore, a data stream or a sequence of signals representing the computer program for performing one of the methods described herein. The data stream or the sequence of signals may for example be configured to be transferred via a data communication connection, for example via the Internet.

A further embodiment comprises a processing means, for example a computer, or a programmable logic device, configured to or adapted to perform one of the methods described herein.

A further embodiment comprises a computer having installed thereon the computer program for performing one of the methods described herein.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods are performed by any hardware apparatus.

While this invention has been described in terms of several advantageous embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

The above described embodiments are merely illustrative for the principles of the present invention. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

Although each claim only refers back to one single claim, the disclosure also covers any conceivable combination of claims.

The invention claimed is:

1. A circuitry for a correction of errors in a possibly erroneous binary word $v'=v'_1, \ldots, v'_n$ relative to a codeword $v=v_1, \ldots, v_n$, the circuitry comprising:

a syndrome generator for determining an error syndrome $s=(s_1, s_3)$ according to a modified BCH code with a H-matrix $H^{mod}$ comprising a first BCH submatrix $H_1^{mod}$ and a second BCH submatrix $H_3^{mod}$, and with a code distance $d \geq 5$, wherein n' column vectors of the BCH submatrix $H_1^{mod}$ are paired as column vector pairs so that a componentwise XOR combination of the two column vectors of each column vector pair produces an identical column vector K that is different from all column vectors of the first BCH submatrix $H_1^{mod}$ and where n' is even and $4 \leq n' \leq n$ applies, wherein the second BCH submatrix $H_3^{mod}$ comprises a corresponding column vector for each column vector in the first BCH submatrix $H_1^{mod}$ so that the corresponding column vector is a third power, according to Galois field arithmetic, of the column vector in the first BCH submatrix $H_1^{mod}$, wherein the syndrome generator is configured to determine the error syndrome s by multiplying the H-matrix $H^{mod}$ with the possibly erroneous binary word v' so that a first error syndrome portion is given by $s_1=H_1^{mod} \cdot v'$ and a second error syndrome portion is given by $s_3=H_3^{mod} \cdot v'$; and a decoder for generating a correction vector $e=(e_1, \ldots, e_n)$ with correction values $e_j=e_{j+1}=e_l=1$ and $e_t=0$ for $t \neq j, j+1, l$, if the first error syndrome portion $s_1$ equals the componentwise XOR combination of the identical column vector K and a column vector at a column position l of the first BCH submatrix $H_1^{mod}$, and if the second error syndrome portion $s_3$ equals the componentwise XOR combination of column vectors at column positions j, j+1, and l of the second BCH submatrix $H_3^{mod}$.

2. The circuitry according to claim 1, wherein the column vectors of the first BCH submatrix $H_1^{mod}$ are designated as $h_j^1$ with $j=1, \ldots, n$ and are equal to a vector representation of elements $\alpha^{ij}$ of a Galois field $GF(2^m)$ with $\alpha$ being an element of the Galois field $GF(2^m)$, and the column vectors of the second BCH submatrix $H_3^{mod}$ are designated as $h_j^3$ and are equal to a vector representation of elements $\alpha^{3ij}$ of the Galois field $GF(2^m)$, and wherein m is a length of the column vectors of $h_j^1$ and $h_j^3$.

3. The circuitry according to claim 2, wherein $\alpha$ is a primitive element of the Galois field $GF(2^m)$.

4. The circuitry according to claim 1, wherein the decoder is configured so that it forms n binary correction values $e_1, \ldots, e_n$ for correcting corresponding bits $v'_1, \ldots, v'_n$ of the binary word v' from the components $s_1, s_3, s_P$ of the error syndrome s, wherein $s_P$ is an overall parity of the codeword v, and wherein the correction values $e_1, \ldots, e_n$ are determined from the values of the syndrome components $s_1, s_3, s_P$ and the binary vector K so that the decoder Dec in case of a 1-bit error or a 2-bit error outputs a correction value $e_j=1$ at its j-th output for $j=1, \ldots, n$, when $$s_1^3 \oplus s_3 \oplus s_1^2 \alpha^{ij} \oplus s_1 \alpha^{2ij}=0$$

and outputs a correction value $e_j=0$ at its j-th output when $$s_1^3 \oplus s_3 \oplus s_1^2 \alpha^{ij} \oplus s_1 \alpha^{2ij} \neq 0$$

and in case of a 3-bit error outputs a correction value $e_j=1$ at its j-th output for $j=1, \ldots, n$ when $$s_1^3 \oplus s_3 \oplus s_1^2 K \oplus s_1 K^2 \oplus K^2 \alpha^{ij} \oplus K \alpha^{2ij}=0$$

or $$s_1 \oplus J = \alpha^{ij}$$

and in case of a 3-bit error outputs a correction value $e_1=0$ at its j-th output for $j=1, \ldots, n$, when both $$s_1^3 \oplus s_3 \oplus s_1^2 K \oplus s_1 K^2 \oplus K^2 \alpha^{ij} \oplus K \alpha^{2ij} \neq 0$$

and $$s_1 \oplus K \neq \alpha^{ij}$$

apply.

5. The circuitry according to claim 1, wherein the decoder comprises:

an auxiliary subcircuit for forming at least one auxiliary signal on a basis of the first error syndrome portion $s_1$, the second error syndrome portion $s_3$, and the identical column vector K; and a plurality of decoder subcircuits, each decoder subcircuit being associated to a specific bit of the binary word v', being configured for receiving the at least one auxiliary signal and for determining a corresponding correction value of the correction vector e.

6. The circuitry according to claim 5, wherein the auxiliary subcircuit is configured to form the following auxiliary signals:

"3-bit error", which is equal 1, when both $s_1^3 \oplus s_3 \neq 0$ and $s_P=1$, and which is equal 0 otherwise;

an m bit wide signal $(s_1^3 \oplus s_3)'$ which is equal $s_1^3 \oplus s_3$ for $(s_1, s_3) \neq 0$, and equal $$\underbrace{(1, 0, \ldots, 0)}_{m}$$

for $(s_1, s_3)=0$; and $$s_1^3 \oplus s_3 \oplus s_1 K^2 \oplus s_1^2 K;$$

wherein $s_P$ is an overall parity of a data word v'.

7. The circuitry according to claim 6, wherein a j-th decoder subcircuit for a corresponding bit $v'_j$ of the binary is configured to output a correction value $e_j=1$, when $$s_1^3 \oplus s_3 \oplus s_1^2 \alpha^{ij} \oplus s_1 \alpha^{2ij} = 0 \text{ OR}$$

$$s_1^3 \oplus s_3 \oplus s_1^2 K \oplus s_1 K^2 \oplus K^2 \alpha^{ij} \oplus K \alpha^{2ij} = 0 \text{ OR}$$

$$s_1 \oplus K = \alpha^{ij},$$

and to output a correction value $e_j=0$, when $$s_1^3 \oplus s_3 \oplus s_1^2 \alpha^{ij} \oplus s_1 \alpha^{2ij} \neq 0 \text{ OR}$$

$$(s_1^3 \oplus s_3 \oplus s_1^2 K \oplus s_1 K^2 \oplus K^2 \alpha^{ij} \oplus K \alpha^{2ij} \neq 0 \text{ AND } s_1 \oplus K \neq \alpha^{ij}).$$

8. The circuitry according to claim 1, wherein the possibly erroneous binary word v' is an auxiliary read value provided by an auxiliary read value generator of a circuit for reading a memory with memory cells with more than two states.

9. The circuitry according to claim 1, wherein for n even at least one pair of the pairs of bits $[v'_1, v'_2], [v'_3, v'_4] \ldots, [v'_{n-1}, v'_n]$ and for n odd at least one pair of the pairs of bits $[v'_1, v'_2], [v'_3, v'_4] \ldots, [v'_{n-2}, v'_{n-1}]$ is stored in a memory cell with more than two states.

10. A method for correcting errors in a possibly erroneous binary word $v'=v'_1, \ldots, v'_n$ relative to a codeword $v=v_1, \ldots, v_n$, the method comprising:

determining an error syndrome $s=(s_1, s_3)$ of a modified BCH code with a H-matrix $H^{mod}$ comprising a first BCH submatrix $H_1^{mod}$ and a second BCH submatrix $H_3^{mod}$, and with a code distance $d \geq 5$, wherein n' column vectors of the submatrix $H_1^{mod}$ are paired as column vector pairs so that a componentwise XOR combination of the two column vectors of each column vector pair produces an identical column vector K that is different from all column vectors of the BCH submatrix $H_1^{mod}$, and where n' is even and $4 \leq n' \leq n$ applies, wherein the second BCH submatrix $H_3^{mod}$ comprises a corresponding column vector for each column vector in the first BCH submatrix $H_1^{mod}$ so that the corresponding column vector is a third power, according to Galois field arithmetic, of the column vector in the first BCH submatrix $H_1^{mod}$, wherein the error syndrome s is determined by multiplying the H-matrix $H^{mod}$ with the possibly erroneous binary word v' so that a first error syndrome portion is given by $s_1 = H_1^{mod} \cdot v'$ and a second error syndrome portion is given by $s_3 = H_3^{mod} \cdot v'$; and generating a correction vector $e=(e_1, \ldots, e_n)$ with correction values $e_j=e_{j+1}=e_l=1$ and $e_t=0$ for $t \neq j, j+1, l$, if $s_1$ equals the componentwise XOR combination of the identical column vector K and a column vector at a column position 1 of the first BCH submatrix $H_1^{mod}$, and $s_3$ equals the componentwise XOR combination of column vectors at column positions j, j+1, and 1 of the second BCH submatrix $H_3^{mod}$.

11. A non-transitory storage medium having stored thereon a computer program having a program code for performing, when running on a computer, a method for correcting errors in a possibly erroneous binary word $v'=v'_1, \ldots, v'_n$ relative to a codeword $v=v_1, \ldots, v_n$, the method comprising:

determining an error syndrome $s=(s_1, s_3)$ of a modified BCH code with a H-matrix $H^{mod}$ comprising a first BCH submatrix $H_1^{mod}$ and a second BCH submatrix $H_3^{mod}$, and with a code distance $d \geq 5$, wherein n' column vectors of the submatrix $H_1^{mod}$ are paired as column vector pairs so that a componentwise XOR combination of the two column vectors of each column vector pair produces an identical column vector K that is different from all column vectors of the BCH submatrix $H_1^{mod}$, and where n' is even and $4 \leq n' \leq n$ applies, wherein the second BCH submatrix $H_3^{mod}$ comprises a corresponding column vector for each column vector in the first BCH submatrix $H_1^{mod}$ so that the corresponding column vector is a third power, according to Galois field arithmetic, of the column vector in the first BCH submatrix $H_1^{mod}$, wherein the error syndrome s is determined by multiplying the H-matrix $H^{mod}$ with the possibly erroneous binary word v' so that a first error syndrome portion is given by $s_1 = H_1^{mod} \cdot v'$ and a second error syndrome portion is given by $s_3 = H_3^{mod} \cdot v'$; and generating a correction vector $e=(e_1, \ldots, e_n)$ with correction values $e_j=e_{j+1}=e_l=1$ and $e_t=0$ for $t \neq j, j+1, l$, if $s_1$ equals the componentwise XOR combination of the identical column vector K and a column vector at a column position 1 of the first BCH submatrix $H_1^{mod}$, and $s_3$ equals the componentwise XOR combination of column vectors at column positions j, j+1, and 1 of the second BCH submatrix $H_3^{mod}$.

12. A circuitry for a correction of errors in a possibly erroneous binary word $v'=v'_1, \ldots, v'_n$, which, if errors occurred, resulted due to these errors from a codeword $v=v_1, \ldots, v_n$ of a linear code with a H-matrix $H^{mod}$ of $m' \geq 2m$ lines and n columns and with a code distance $d \geq 5$, and if no errors occurred, is equal to the codeword $v=v_1, \ldots, v_n$ of this code, wherein 1-bit errors, 2-bit errors and 3-bit errors containing a neighboring 2-bit error may be corrected, wherein $n<2^m$ and $m \geq 3$ applies, wherein the circuitry comprises a syndrome generator Synd for determining at least a (2m)-digit error syndrome s from the possibly erroneous binary word v', and wherein the error correction is executed depending on the error syndrome determined by the syndrome generator by a decoder Dec downstream from the syndrome generator, wherein the syndrome generator Synd comprises n binary inputs and at least 2m binary outputs and is implemented so that when a binary word $v'=v'_1, \ldots, v'_n$ is input at its inputs, it outputs an error syndrome $s=(s_1, s_3)$ assigned to the input binary word v' at 2m binary outputs, wherein $s_1$ and $s_3$ are each m-digit binary vectors and the error syndrome s is determined by $$s = H^{mod} \cdot v'$$

and $H^{mod}$ is a [m',n] matrix of n column vectors $h_1, \ldots, h_n$ having m' components each and for j=1, ..., n the column vector $h_j$ consists of m first components forming the vector $h_j^1$, and of a second vector $h_j^3$ of the following m components of the column vector $h_j$, so that the following applies $$h_j = \begin{pmatrix} h_j^1 \\ h_j^3 \end{pmatrix} = \begin{pmatrix} \alpha^{ij} \\ \alpha^{3(ij)} \end{pmatrix}$$

wherein $h_j^1$ is equal to a vector representation of an element $\alpha^{ij}$ of a Galois field $GF(2^m)$ and $h_j^3$ is equal to a vector representation of the element $\alpha^{3ij}$ of the Galois field $GF(2^m)$ and $\alpha$ is an element of the Galois field $GF(2^m)$ and the first m components $h_1^1, \ldots, h_n^1$, of the column vectors $h_1, \ldots, h_{n'}$ of the H matrix H are determined so that for n' even and $4 \leq n' \leq n$ $$\alpha^{j1} \oplus \alpha^{j2} = h_1^1 \oplus h_2^1 = K$$
$$\alpha^{j3} \oplus \alpha^{j4} = h_3^1 \oplus h_4^1 = K$$
$$\vdots \qquad \vdots \qquad \vdots$$
$$\alpha^{jn'-1} \oplus \alpha^{jn'} = h_{n'-1}^1 \oplus h_{n'}^1 = K$$

applies, wherein K is an m-component binary vector, so that none of the m-component vectors $h_1^1, \ldots, h_n^1$ is equal K, and wherein $s_1, s_3$ are determined by $$s_1 = H_1^{mod} \cdot v',$$
$$s_3 = H_3^{mod} \cdot v',$$

wherein $H_1^{mod} = (h_1^1, \ldots, h_n^1)$, $H_3^{mod} = (h_1^3, \ldots, h_n^3)$ apply and the exponents $i_j$ and $3i_j$ of $\alpha^{ij}$ and $\alpha^{3ij}$ are each determined modulo $2^m-1$ and v' is an n-component column vector with the components $v'_1, \ldots, v'_n$, and wherein the decoder Dec comprises at least 2m binary inputs connected to the outputs of the syndrome generator Synd which carry the components of the error syndrome $s=(s_1, s_3)$ and n binary outputs of the decoder Dec exist for outputting n binary correction values $e_1, \ldots, e_n$ for correcting corresponding bits $v'_1, \ldots, v'_n$ of the binary word v', wherein the correction values $e_1, \ldots, e_n$ are determined from the values of the syndrome components $s_1, s_3$ and the binary vector K, and the decoder Dec is configured such that
when an error syndrome s=0 is applied to its input it outputs a correction vector e=0 at its output,
when an error syndrome $s=(s_1, s_3)$ with $$s_1 = \alpha^{ij}, s_3 = \alpha^{3(ij)}$$

is applied to its input, it outputs $e_j=1$ and $e_t=0$ for $t \neq j$,
when an error syndrome $s=(s_1, s_3)$ with $$s_1 = \alpha^{ij} \oplus \alpha^{ir}, s_3 = \alpha^{3(ij)} \oplus \alpha^{3(ir)}$$

is applied to its input, it outputs $e_j=1$, $e_r=1$ and $e_t=0$ for $t \neq j, r$,
when an error syndrome $s=(s_1, s_3)$ with $$s_1 = \alpha^{ij} \oplus \alpha^{ij+1} \oplus \alpha^{il}, s_3 = \alpha^{3(ij)} \oplus \alpha^{3(ij+1)} \oplus \alpha^{3(il)}$$

is applied to its input, wherein $\alpha^{ij} \oplus \alpha^{ij+1} = K$ and $j+1 \leq n'$ applies, and wherein K is no column of the matrix $H_1^{mod}$, it outputs the correction values $e_j=1$, $e_{j+1}=1$ and $e_l=1$ and $e_t=0$ for $t \neq j, j+1, l$.

13. The circuitry according to claim 12, wherein the syndrome generator Synd comprises a (2m+1)-th output for outputting an additional bit $s_P$ of the error syndrome, wherein $s_P$ is determined as a parity bit $s_P = v'_1 \oplus v'_2 \oplus \ldots \oplus v'_n$, and wherein an additional (m+1)-th input of the decoder Dec exists for inputting the syndrome component $s_P$.

14. The circuitry according to claim 13, wherein the decoder forms a parity syndrome $s_P$ by an XOR combination from those components of the error syndrome which correspond to the components of the columns of the H matrix $H^{mod}$ which comprise an odd number of ones.

15. The circuitry according to claim 13, wherein the decoder Dec is configured so that it forms n binary correction values $e_1, \ldots, e_n$ for correcting the corresponding bits $v'_1, \ldots v'_n$ of the binary word v' from the components $s_1, s_3, s_P$ of the error syndrome s, wherein the correction values $e_1, \ldots, e_n$ are determined from the values of the syndrome components $s_1, s_3, s_P$ and the binary vector K so that the decoder Dec in case of a 1-bit error or a 2-bit error outputs a correction value $e_j=1$ at its j-th output for $j=1, \ldots, n$, when $$s_1^3 \oplus s_3 \oplus s_1^2 \alpha^{ij} \oplus s_1 \alpha^{2ij} = 0$$

and outputs a correction value $e_j=0$ at its j-th output when $$s_1^3 \oplus s_3 \oplus s_1^2 \alpha^{ij} \oplus s_1 \alpha^{2ij} \neq 0$$

and in case of a 3-bit error outputs a correction value $e_j=1$ at its j-th output for $j=1, \ldots, n$ when $$s_1^3 \oplus s_3 \oplus s_1^2 K \oplus s_1 K^2 \oplus K^2 \alpha^{ij} \oplus K \alpha^{2ij} = 0$$

or $$s_1 \oplus K = \alpha^{ij}$$

and in case of a 3-bit error outputs a correction value $e_j=0$ at its j-th output for $j=1, \ldots, n$, when both $$s_1^3 \oplus s_3 \oplus s_1^2 K \oplus s_1 K^2 \oplus K^2 \alpha^{ij} \oplus K \alpha^{2ij} \neq 0$$

and $$s_1 \oplus K \neq \alpha^{ij}$$

apply.

16. The circuitry according to claim 13, further comprising a combinational circuit for combining the correction values $e_1, \ldots, e_n$ output by the decoder with the components $v'_1, \ldots, v'_n$ of a data word into corrected data bits $v_1^{cor}, \ldots, v_n^{cor}$, wherein the combinational circuit is configured to realize for $j=1, \ldots, n$ a respectively uniquely invertible combination of the correction value $e_1$ with the corresponding data bit $v'_j$.

17. The circuitry according to claim 12, wherein the columns $h_1, \ldots, h_n$ of the H matrix $H^{mod}$ are determined so that the number of ones in a subset of components of these columns is odd.

18. The circuitry according to claim 12, wherein for n even at least one pair of the pairs of bits $[v'_1, v'_2], [v'_3, v'_4] \ldots, [v'_{n-1}, v'_n]$ and for n odd at least one pair of the pairs of bits $[v'_1, v'_2], [v'_3, v'_4] \ldots, [v'_{n-2}, v'_{n-1}]$ is stored in a memory cell with more than two states.

19. The circuitry according to claim 12, wherein $H^{mod}$ is an [m',n] matrix of n column vectors $h_1, \ldots, h_n$ each having m' components and for $j=1, \ldots, n$ the column vector $h_j$ consists of m first components which form the vector $h_j^1$, of m following components which form the second vector $h_j^3$, and of m following components of the column vector $h_j$ which form a third vector $h_j^5$, so that $$h_j = \begin{cases} h_j^1 = \alpha^{ij} \\ h_j^3 = \alpha^{3(ij)} \\ h_j^5 = \alpha^{5(ij)} \end{cases}$$

applies, $H_5^{mod}=h_1^5, \ldots, h_n^5$), wherein $h_j^1$ is equal to the vector representation of an element $\alpha^{ij}$ of the Galois field $GF(2^m)$ and wherein $h_j^3$ is equal to the vector representation of the element $\alpha^{3ij}$ of the Galois field $GF(2^m)$ and $h_j^5$ is equal to a vector representation of the element $\alpha^{5(ij)}$ of the Galois field $GF(2^m)$, and further an error indication circuit having n binary input lines and with an at least 1-bit wide output for outputting an at least 1-bit wide output signal q exists whose inputs are connected to an n-digit output of an XOR circuit which carry a corrected data word $v^{cor}$, wherein the error indication circuit is implemented so that it outputs a first value $q_1$ when a non-correctable 3-bit error exist and so that it outputs a second value $q_2$ which is different from $q_1$ when a correctable 3-bit error with a neighboring 2-bit error exist.

20. The circuitry according to claim 19, wherein the error indication circuit is implemented so that it realizes the function $q=[s_{5_1}]' \vee [s_{5_2}]' \vee \ldots \vee [s_{5_m}]'$ wherein $([s_{5_1}]', \ldots, [s_{5_m}]')=H_5^{mod} \cdot v^{cor}$ applies.

21. The circuitry according to claim 19, wherein the error indication circuit is implemented so that it realizes the function $q=[s_{5_{i_1}}]' \vee \ldots \vee [s_{5_{i_M}}]'$ wherein $([s_{5_1}]', \ldots, [s_{5_m}]')=H_5^{mod} \cdot v^{cor}$ applies and $\{[s_{5_{i_1}}]', \ldots, [s_{5_{i_M}}]'\}$ is a subset of $\{[s_{5_1}]', [s_{5_2}]', \ldots, [s_{5_m}]'\}$ and M<m applies.

22. The circuitry according to claim 12, wherein $H^{mod}$ is a [m',n] matrix of n column vectors $h_1, \ldots, h_n$ with m' components each and for j=1, ..., n the column vector $h_j$ consists of m first components forming the vector $h_j^1$ and a second vector $h_j^3$ consists of the following m components of the column vector $h_j$ and of a third vector $h_j^5$ of further m components, so that $$h_j = \begin{cases} h_j^1 = \alpha^{ij} \\ h_j^3 = \alpha^{3(ij)} \\ h_j^5 = \alpha^{5(ij)} \end{cases}$$

applies, $H_5^{mod}=(h_1^5, \ldots, h_n^5)$, wherein $h_j^1$ is equal to the vector representation of an element $\alpha^{ij}$ of the Galois field $GF(2^m)$ and $h_j^3$ is equal to the vector representation of the element $\alpha^{3ij}$ of the Galois field $GF(2^m)$ and $h_j^5$ is equal to a vector representation of the element $\alpha^{5(ij)}$ of the Galois field $GF(2^m)$ and further the decoder is implemented so that it comprises an output for outputting an error indication signal q', wherein q' takes on a first value $q'_1$ when $s_1^6 \oplus s_3^2 \oplus s_1^5 K \oplus K s_5 \oplus K^3 s_3 \oplus K^3 s_1^3 = 0$ applies and q' takes on a second value $q'_2$ which is different from the first value $q'_1$ when $s_1^6 \oplus s_3^2 \oplus s_1^5 K \oplus K s_5 \oplus K^3 s_3 \oplus K^3 s_1^3 \neq 0$ applies.

23. The circuitry according to claim 12, wherein $\alpha$ is a primitive element of the Galois field $GF(2^m)$.

24. The circuitry according to claim 12, wherein subcircuits of the circuitry for correcting of errors in possibly erroneous binary word are partially jointly optimized.

* * * * *

UNITED STATES PATENT AND TRADEMARK OFFICE
CERTIFICATE OF CORRECTION

PATENT NO. : 9,203,437 B2
APPLICATION NO. : 13/720780
DATED : December 1, 2015
INVENTOR(S) : Thomas Kern et al.

Page 1 of 1

It is certified that error appears in the above-identified patent and that said Letters Patent is hereby corrected as shown below:

In the claims
In Col. 36, line 54, claim 16, delete "correction value $e_1$" and insert -- correction value $e_j$ --.

Signed and Sealed this
Twelfth Day of April, 2016

Michelle K. Lee
*Director of the United States Patent and Trademark Office*